(12) United States Patent
Lu et al.

(10) Patent No.: US 10,141,285 B2
(45) Date of Patent: Nov. 27, 2018

(54) EXTERNALLY INDUCED CHARGE PATTERNING USING RECTIFYING DEVICES

(71) Applicant: Palo Alto Research Center Incorporated, Palo Alto, CA (US)

(72) Inventors: JengPing Lu, Fremont, CA (US); David K. Biegelsen, Portola Valley, CA (US); Jason Thompson, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1040 days.

(21) Appl. No.: 14/031,529

(22) Filed: Sep. 19, 2013

(65) Prior Publication Data
US 2015/0077172 A1    Mar. 19, 2015

(51) Int. Cl.
*B23P 19/00* (2006.01)
*H01L 23/00* (2006.01)
*B81C 3/00* (2006.01)
*B81C 99/00* (2010.01)

(52) U.S. Cl.
CPC .............. *H01L 24/95* (2013.01); *B81C 3/004* (2013.01); *B81C 99/002* (2013.01); *B81C 2203/051* (2013.01); *H01L 2924/12032* (2013.01); *H01L 2924/12042* (2013.01); *H01L 2924/12043* (2013.01); *Y10T 29/49016* (2015.01)

(58) Field of Classification Search
CPC ....... Y10T 29/531178; Y10T 29/53174; Y10T 29/5313; Y10T 29/53; H01L 2924/12032; H01L 2924/12043; H01L 2924/12042; H01L 2924/00; B81C 2203/051; B81C 99/002

USPC ......... 29/740, 739, 729, 700, 832, 829, 825, 29/592.1; 361/748; 327/510, 509, 514
See application file for complete search history.

(56) References Cited

U.S. PATENT DOCUMENTS 3,172,024 A * 3/1965 Gundlach .......... G03G 15/0216
                                                    250/325
4,062,103 A * 12/1977 Yamagishi ........ H01L 21/28581
                                                    257/473
5,070,035 A * 12/1991 Hattori .............. H01L 21/28264
                                                    257/E21.266
6,923,979 B2    8/2005 Fotland
(Continued)

FOREIGN PATENT DOCUMENTS

JP    H05164609    6/1993
JP    H05184163    7/1993

OTHER PUBLICATIONS

U.S. Appl. No. 14/031,392, filed Sep. 19, 2013; Thompson, et al., Method for Reduction of Stiction While Manipulating Micro Objects on a Surface.
(Continued)

*Primary Examiner* — A. Dexter Tugbang
*Assistant Examiner* — Azm Parvez
(74) *Attorney, Agent, or Firm* — Fay Sharpe LLP

(57) ABSTRACT

A system and method form charge patterns on micro objects. The system and method employ a micro object including a rectifying device. The rectifying device exhibits an asymmetric current-voltage (I-V) response curve. Further, the system and method employ a device external to the micro object to induce the flow of charge through the rectifying device.

13 Claims, 30 Drawing Sheets

(56) References Cited

U.S. PATENT DOCUMENTS

| | | | |
|---|---|---|---|
| 7,861,405 B2* | 1/2011 | Chow | B81C 99/002 |
| | | | 29/729 |
| 8,181,336 B2 | 5/2012 | Chow et al. | |
| 8,312,619 B2 | 11/2012 | Chow et al. | |
| 8,581,167 B2* | 11/2013 | Lean | G03G 15/758 |
| | | | 250/208.1 |
| 8,685,769 B1* | 4/2014 | Chow | G03G 5/02 |
| | | | 438/29 |
| 2002/0005294 A1 | 1/2002 | Mayer | |
| 2006/0057293 A1 | 3/2006 | Sharma | |
| 2006/0128057 A1* | 6/2006 | Lu | H01L 21/67271 |
| | | | 438/106 |
| 2009/0096386 A1* | 4/2009 | Yeh | H01L 25/0753 |
| | | | 315/294 |
| 2009/0218260 A1 | 9/2009 | Chow | |
| 2010/0186221 A1 | 7/2010 | Chow et al. | |
| 2012/0119072 A1* | 5/2012 | Lean | G03G 15/758 |
| | | | 250/214.1 |
| 2014/0106541 A1 | 4/2014 | Chow et al. | |
| 2015/0076961 A1 | 3/2015 | Thompson et al. | |
| 2015/0262856 A1 | 9/2015 | Thompson et al. | |

OTHER PUBLICATIONS

U.S. Appl. No. 14/031,468, filed Sep. 19, 2013; Thompson, et al., Direct Electrostatic Assembly With Capacitively Coupled Electrodes.

U.S. Appl. No. 13/652,194, filed Oct. 15, 2012; Chow, et al., Microchip Charge Patterning.

\* cited by examiner

EXTERNALLY INDUCED CHARGE PATTERNING USING RECTIFYING DEVICES

GOVERNMENT FUNDING

This invention was made with Government support under W91CRB-12-C-0006 awarded by the Defense Advanced Research Projects Agency (DARPA). The government has certain rights in this invention.

BACKGROUND

The present application relates generally to micro assemblies. It finds particular application in conjunction with micro-assembly techniques used for fabricating micro assemblies, and will be described with particular reference thereto. However, it is to be appreciated that the present application is also amenable to other like applications.

Micro assembly pertains to assembling micro objects into micro assemblies. Micro objects are typically a few microns to 100s of microns in size (e.g., 1-500 microns in length, width or area) and include, for example, microchips. One technique for micro assembly employs electrostatic or magnetic fields to manipulate micro objects. In this technique, patterns are first electrostatically or magnetically encoded on the micro objects. Thereafter, the patterns are used for manipulation of the micro objects in electric or magnetic fields. The patterns can also be used for identifying and/or matching micro objects, similar to biological molecular recognition.

One challenge with the above-referenced technique pertains to accurately moving micro objects in the presence of stiction. Stiction is the difference between the coefficient of static friction and dynamic friction resulting from the intermolecular forces between the two contacting surfaces. When attempting to move a micro object in the presence of stiction, the forces required to initiate motion are often significantly greater than the forces required to maintain motion. As a result, attempts at fine control over the position of a micro object subject to stiction often result in ringing, overshoot and instabilities in the control.

Another challenge with the above-referenced technique pertains to patterning micro objects. Many different techniques exist for patterning, including techniques based on chemical means, such as dielectric additives enabling positive or negative charge build up on micro objects, and techniques based on physical means, such as corona charging. The known techniques commonly used today can be broken into two distinct groups. The first group uses Gyricon bichromal spheres, which develop a dipole when suspended in an electrolyte due to different zeta potentials of the surfaces of the two hemispheres. The second group uses electrophoretic ink consisting of two types of oppositely charging particles. Known examples of these two groups are believed to use proton exchange based on different acidity levels of the chemical agents. Further, some of these examples are believed to be based on tribocharging. However, tribocharging and proton exchange with electrolytes are somewhat uncontrolled and immersion in electrolytes leads to complications from ion screening.

A micro assembler employing the above-referenced technique is described in U.S. Patent App. Pub. No. 2009/0218260. The micro assembler positions and orients patterned micro objects on an intermediary substrate using a planar electrode array. Thereafter, the micro objects are transferred to a final substrate for planarization and wiring. This micro assembler requires the electrode array to be permanently affixed to the substrate upon which the micro objects are manipulated, thereby necessitating both the intermediary substrate and the final substrate.

The present application provides new and improved methods and systems which improve on the above-referenced technique and address the above-referenced challenges.

INCORPORATION BY REFERENCE

U.S. patent application Ser. No. 14/031,932 (U.S. Patent App. Pub. No. 2015/0076961) for "A Method for Reduction of Stiction while Manipulating Micro Objects on a Surface", by Thompson et al., filed on Sep. 19, 2013, U.S. patent application Ser. No. 14/031,468 (U.S. Patent App. Pub. No. 2015/0262856) for "Direct Electrostatic Assembly with Capacitively Coupled Electrodes", by Thompson et al., filed on Sep. 19, 2013 (U.S. Pat. No. 9,431,283), U.S. patent application Ser. No. 13/652,194 (U.S. Patent App. Pub. No. 2014/0106541) for "Microchip Charge Patterning", by Chow et al., filed on Oct. 15, 2012, U.S. patent application Ser. No. 12/041,375 (U.S. Patent App. Pub. No. 2009/0218260) (U.S. Pat. No. 7,861,405) for "A System for Forming a Micro-Assembler", by Chow et al., filed Mar. 3, 2008, U.S. patent application Ser. No. 12/754,245 (U.S. Patent App. Pub. No. 2010/0186221) (U.S. Pat. No. 8,850,694) for "Micro-Assembler", by Chow et al., filed Apr. 5, 2010, U.S. patent application Ser. No. 12/754,230 (U.S. Patent App. Pub. No. 2010/0192365) (U.S. Pat. No. 8,181,336) for "Micro-Assembler", by Chow et al., filed Apr. 5, 2010, U.S. patent application Ser. No. 12/754,254 (U.S. Patent App. Pub. No. 2010/0186222) (U.S. Pat. No. 8,312,619) for "Micro-Assembler", by Chow et al., filed Apr. 5, 2010, and U.S. patent application Ser. No. 12/947,004 (U.S. Patent App. Pub. No. 2012/0119072) (U.S. Pat. No. 8,581,167) for "Optically Patterned Virtual Electrodes and Interconnects on Polymers and Semiconductive Substrate", by Lean et al., filed on Nov. 16, 2010, are all incorporated herein by reference in their entirety.

BRIEF DESCRIPTION

In accordance with one aspect of the present application, a system for forming charge patterns on micro objects is provided. The system includes a micro object including a rectifying device. The rectifying device exhibits an asymmetric current-voltage (I-V) response curve. The system further includes a device external to the micro object configured to induce the flow of charge through the rectifying device.

In accordance with another aspect of the present application, a method for forming charge patterns on micro objects is provided. A micro object including a rectifying device is provided. The rectifying device exhibits an asymmetric current-voltage (I-V) response curve. Further, the flow of charge through the rectifying device is induced by a device external to the micro object.

In accordance with another aspect of the present application, a micro object including a charge pattern is provided. The micro object includes a rectifying device exhibiting a nonlinear response curve and a substrate. Further, the micro object includes a coupling electrode capacitively or magnetically coupling the rectifying device to an external electric or magnetic field generator. An insulator of the micro object isolates the coupling electrode from the substrate.

DETAILED DESCRIPTION

Figure 1:
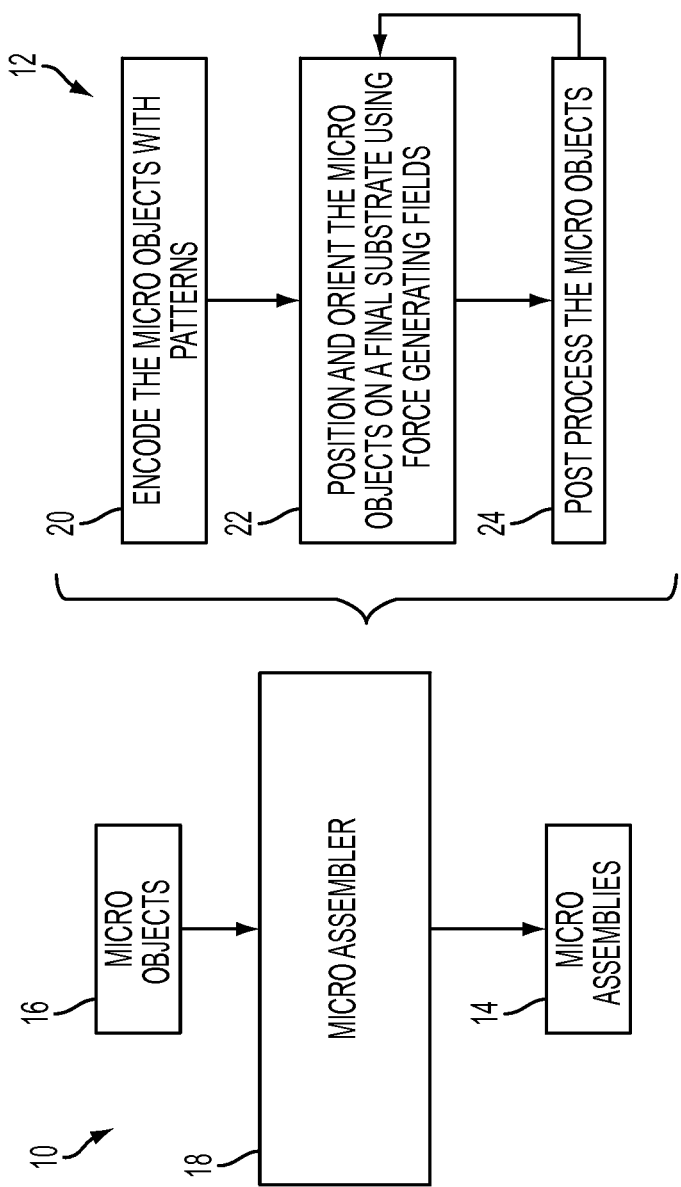
FIG. 1 illustrates a high level view of a system and a method for forming micro assemblies from micro objects.

With reference to FIG. 1, a high level view of a system 10 and a method 12 for forming micro assemblies 14 from micro objects 16 are provided. Each micro assembly 14 is formed from one or more micro objects 16. Further, each micro object 16 of a micro assembly 14 is positioned and oriented in a select relationship to the other micro objects 16 of the micro assembly 14. The micro objects 16 are typically microns to 100s of microns in size (e.g., 1-500 microns in length and/or width) and can include, for example, microchips. Further, typical fabrication techniques are employed to generate the micro objects 16.

As illustrated, a micro assembler 18 receives the micro objects 16, and forms the micro assemblies 14 from the micro objects 16. The method 12 by which the micro assemblies 14 are formed includes individually encoding 20 the micro objects 16 with patterns (i.e., patterning the micro objects 16). Once patterned, the micro objects 16 are positioned and oriented 22 in select relationship to each other on a final substrate using force generating fields, such as electric or magnetic fields. Once finally positioned and oriented, the micro objects 16 undergo post processing 24 to complete the micro assemblies 14.

Expanding upon FIG. 1, the constituent actions are described in greater detail hereafter, beginning with encoding 20 the micro objects 16 with patterns used for manipulation of the micro objects 16. A pattern of a micro object is a pattern of one or more magnetic or electric poles. Magnetic patterns are used for manipulation of the micro objects 16 in magnetic fields, and charge patterns are used for manipulation of the micro objects 16 in electric fields. Further, the patterns can be used for identifying and/or matching the micro objects 16, similar to biological molecular recognition. The pattern of a micro object 16 can be unique to the micro object 16 or unique to a group to which the micro object 16 belongs, such as the type of micro object or the group of micro objects forming a specific micro assembly 14.

Any number of well-known techniques can be employed to encode the micro objects 16 with patterns. These include techniques based on chemical means, such as dielectric additives enabling positive or negative charge build up on the micro objects 16, and techniques based on physical means, such as corona charging. For example, electrophoretic ink consisting of two types of oppositely charging particles can be used to generate charge patterns on the micro objects 16.

In some embodiments, the micro objects 16 are encoded with charge patterns according to U.S. patent application Ser. No. 13/652,194 for "Microchip Charge Patterning", by Chow et al., filed on Oct. 15, 2012, incorporated herein by reference. In such embodiments, the micro objects 16 include material depositions, which define charge patterns when charged. The material depositions can be charged before or after deposition by, for example, submersion of the material depositions in a fluid that causes the charge to develop or through use of an external device, such as a corotron.

Figure 2A:
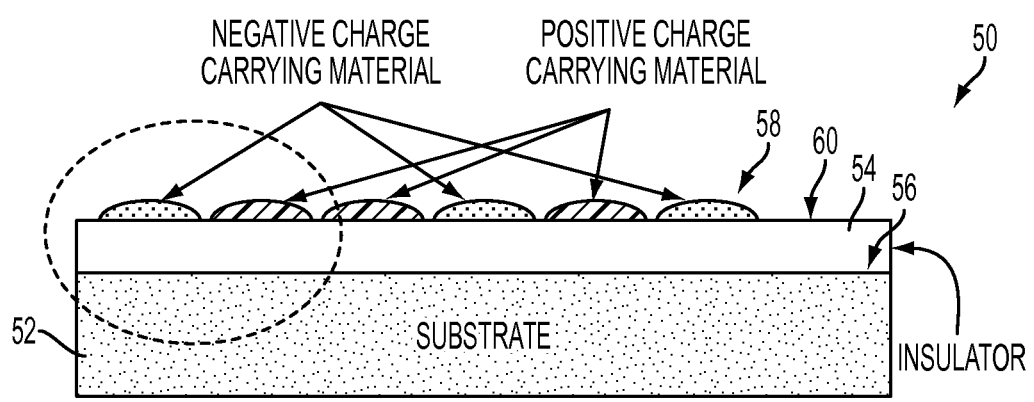
FIG. 2A illustrates a side view of a charge patterned micro object.
Figure 2B:
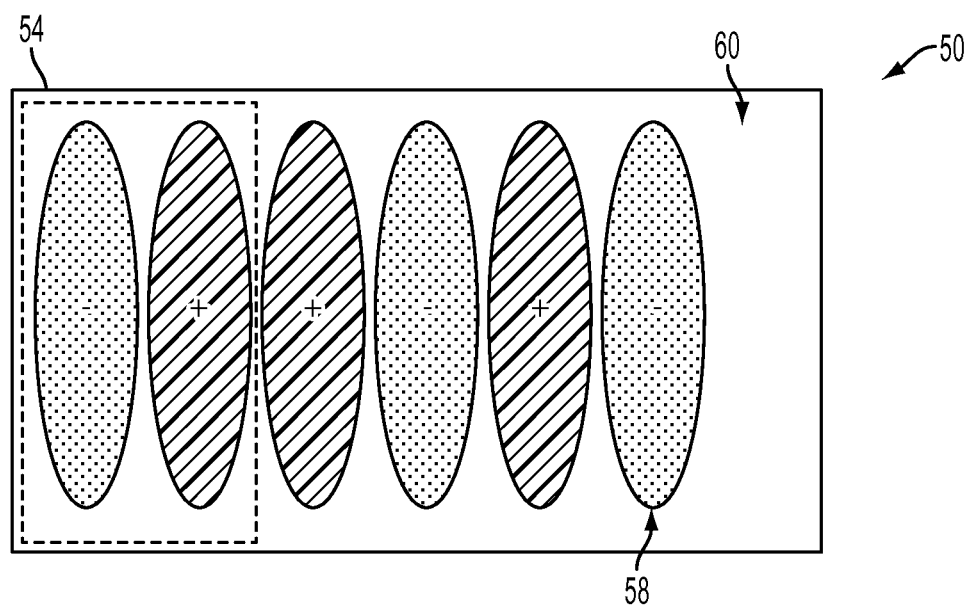
FIG. 2B illustrates a top view of the charge patterned micro object of FIG. 2A.

FIGS. 2A and 2B provide an example of a charge patterned micro object 50 according to U.S. patent application Ser. No. 13/652,194. FIG. 2A provides a side view of the charge patterned micro object 50, and FIG. 2B provides a top view of the charge patterned micro object 50. The charge patterned micro object 50 includes a substrate 52, an insulating layer 54 with a first side 56 adjoining the substrate 52, and one or more material depositions 58 on a second side 60 of the insulating layer 54 opposite the first side 56. The substrate 52 carries components of the micro object 50, such as electronic components, and the insulating layer 54 protects the components of the micro object 50 from the material depositions 58. The material depositions 58 define a charge pattern (illustrated as "−++−+−") when charged.

As an alternative to U.S. patent application Ser. No. 13/652,194, in some embodiments, the micro objects 16 are encoded with charge patterns using rectifying devices. In such embodiments, the micro objects 16 each include one or more rectifying devices, each rectifying device typically connected to at least one coupling electrode. The rectifying devices, such as diodes or varistors, are any devices that exhibit asymmetric current-voltage (I-V) behavior (i.e., a nonlinear response curve), and the coupling electrodes are any region where charge can accumulate. The coupling electrodes are typically disposed laterally on the micro objects 16 and each coupling electrode can be either explicit or implicit. An explicit coupling electrode is a region explicitly defined for the accumulation of charge, and an implicit coupling electrode is a region that isn't explicitly defined for the accumulation of charge but nonetheless accumulates charge.

To pattern the micro objects 16 when using rectifying devices, charge is induced to flow through the rectifying devices by a charging system. The charging system can use any charging technique resulting in rectified charge build ups. For example, where the rectifying devices of the micro objects 16 are photodiodes, the charging system can induce rectified charge buildups by light incident on the photodiodes. As another example, where the rectifying devices of the micro objects 16 are regular diodes, a field generator of the charging system can induce rectified charge buildups by an electric field alternating (randomly or periodically) relative to the micro objects 16, such as a direct current (DC) electric field combined with motion of the micro objects 16, or an alternating current (AC) electric field. As another example, the field generator can induce rectified charge buildup by a magnetic field. The electric or magnetic field is typically generated by a planar array of electrodes or coils, respectively. Further, the electric or magnetic field typically induces charge buildup by capacitive coupling or magnetic coupling, respectively.

Figure 3A:
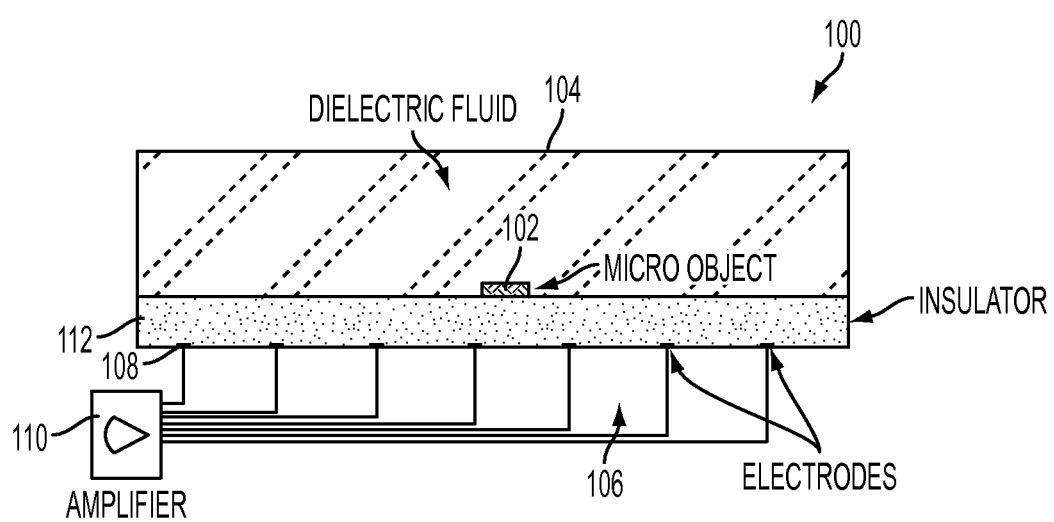
FIG. 3A illustrates a side view of a system for exposing a micro object to an electric field.
Figure 3B:
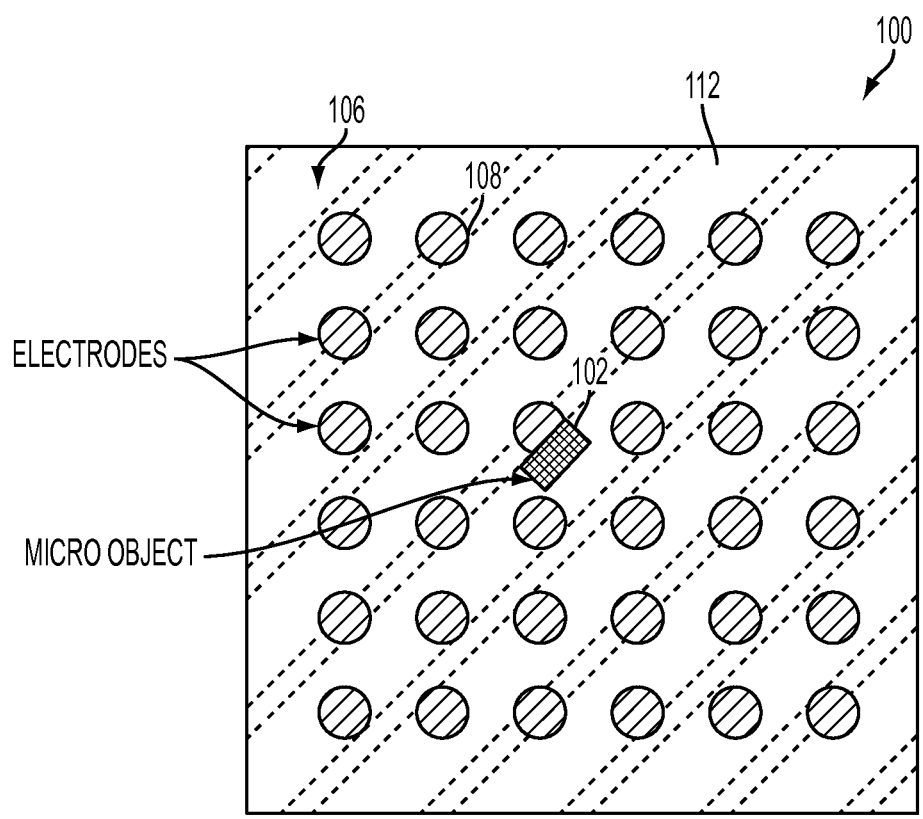
FIG. 3B illustrates a top view of the system of FIG. 3A.

With reference to FIGS. 3A and 3B, a system 100 for exposing a micro object 102 to an electric or magnetic field is provided. FIG. 3A illustrates a side view of the system 100, and FIG. 3B illustrates a top view of the system 100. While not necessary, the system 100 can be used as a charging system. Further, as will be seen, the system 100 can be used as a manipulation system.

The system 100 includes a fluid 104 (e.g., a pure dielectric fluid or air) surrounding the micro object 102 and a planar array 106 comprised of one or more electrodes or coils 108. When the system 100 is being employed to generate an electric field, the planar array 106 includes electrodes, and when the system 100 is being employed to generate a magnetic field, the planar array 106 includes coils. The electrodes or coils 108 are controlled by one or more programmable power sources 110, such as the illustrated multichannel amplifier, to generate the electric or magnetic field. Further, the electrodes or coils 108 are typically arranged in a multi-dimensional grid, such as the illustrated two-dimensional grid. The power sources 110 are typically current or voltage sources, but can also be light sources. Where the power sources 110 are light sources, the electrodes or coils 108 are formed from electrodes of photosensitive material. Such electrodes or coils can, for example, be formed according to U.S. patent application Ser. No. 12/947,004 for "Optically Patterned Virtual Electordes and Interconnects on Polymers and Semiconductive Substrate", by Lean et al., filed on Nov. 16, 2010, incorporated herein by reference. The combination of the planar array 106 and the power sources 110 represents a field generator.

The system 100 further includes a substrate 112 positioned between the micro object 102 and the planar array 106. When the system 100 is being employed to generate an electric field, the substrate 112 is an insulator formed of a polymer, a ceramic, or any other insulating material through which the electric field can pass. When the system 100 is being employed to generate a magnetic field, the substrate 112 is a material with a relative magnetic permeability close to one (i.e., anything non-ferromagnetic or paramagnetic).

Figure 4:
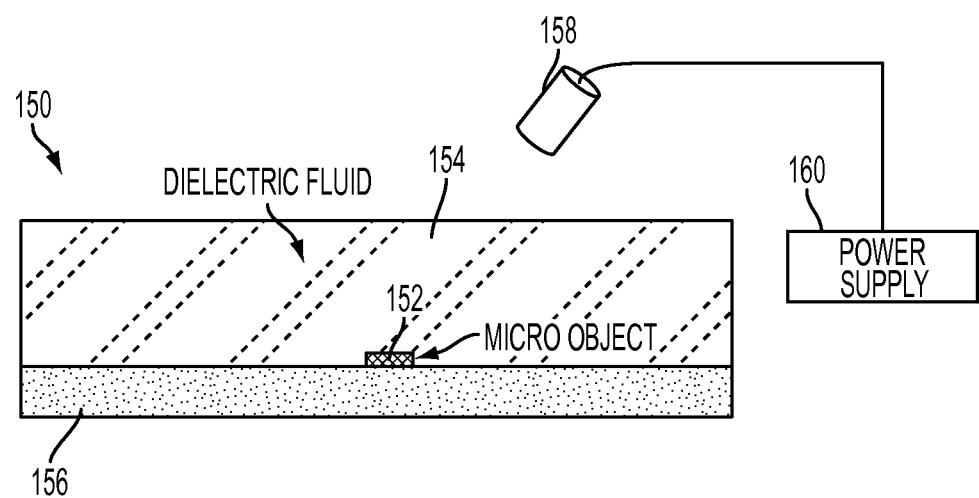
FIG. 4 illustrates a system for exposing a micro object to light.

With reference to FIG. 4, a system 150 for exposing a micro object 152 to light is provided. While not necessary, the system 150 can be used as a charging system. The system 150 includes a fluid 154 (e.g., a pure dielectric fluid or air) surrounding a micro object 152 and a substrate 156 upon which the micro object 152 rests. Even more, the system 150 includes one or more light sources 158 to expose the micro object 152 to light. The light sources 158 are controlled by one or more power sources 160 to illuminate the micro object 152. Further, the light sources 158 can be arranged at different locations around the micro object 152 and/or may be movable.

Figure 5:
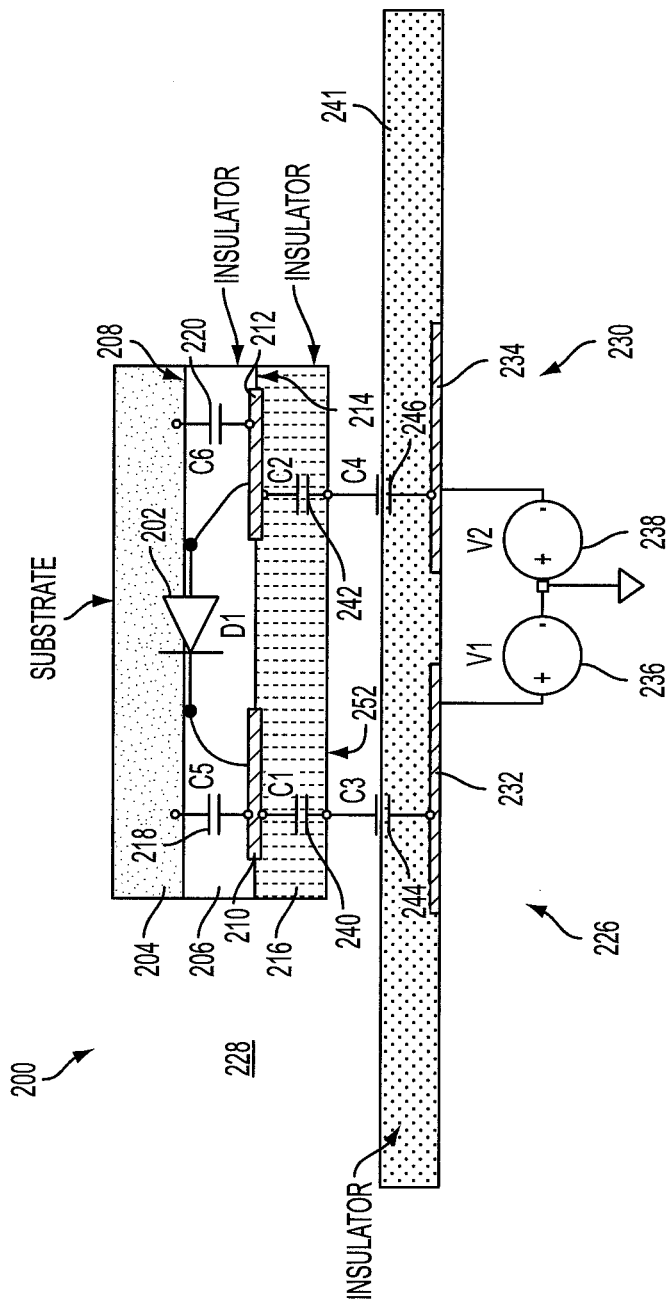
FIG. 5 illustrates a micro object patterned using a rectifying device comprised of a single diode.

With reference to FIG. 5, a micro object 200 patterned using a rectifying device 202 is illustrated. The micro object 200 includes a substrate 204 upon which components (e.g., electrical components) of the micro object 200 are arranged, a first insulator 206 with a first side 208 adjoining the substrate 204, two coupling electrodes 210, 212 adjoining a second side 214 of the first insulator 206 opposite the first side 208, and an optional second insulator 216 adjoining the second side 214 around and over the coupling electrodes 210, 212. Capacitive coupling between the substrate 204 and the coupling electrodes 210, 212 is modeled by capacitors 218, 220.

Figure 6:
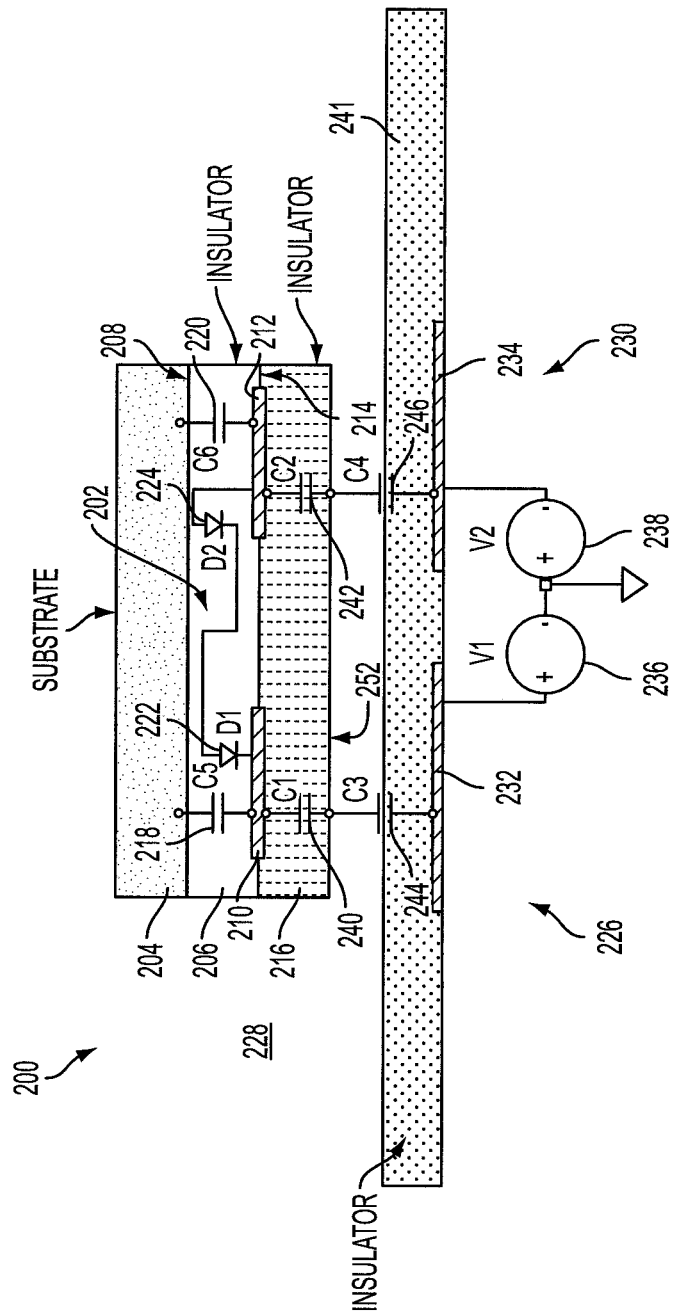
FIG. 6 illustrates a micro object patterned using a rectifying device comprised of two diodes connected in series.

The micro object 200 further includes the rectifying device 202, which is connected between the coupling electrodes 210, 212. As illustrated, the rectifying device 202 is a diode, but it is to be appreciated that the rectifying device 202 need not be a diode. Rather, the rectifying device 202 need only be a device that exhibits asymmetric current-voltage (I-V) behavior. Further, the rectifying device 202 can include a plurality of devices that exhibit asymmetric current-voltage (I-V) behavior. For example, as illustrated in FIG. 6, the rectifying device 202 can be formed of two diodes 222, 224 arranged in series.

With continued reference to FIG. 5, a charging system 226 charges the micro object 200. The charging system 226 can employ any approach to charge the micro object 200, but the approach typically depends upon the type of rectifying device of the micro object 200. For example, where the rectifying device 202 employs regular diodes, the charging system 226 can induce the flow of charge through the rectifying device 202 by generating electric fields alternating relative to the micro object 200 (e.g., as discussed with FIGS. 3A and 3B). As another example, where the rectifying device 202 employs photodiodes, the charging system 226 can induce the flow of charge through the rectifying device 202 with light incident on the rectifying device 202 (e.g., as discussed with FIG. 4).

As illustrated, the charging system 226 induces the flow of charge through the rectifying device 202 by exposing the micro object 200 to an electric field alternating relative to the micro object 200. While any approach to generating the electric field can be employed, the charging system 226 is illustrated as generating the electric field as described with FIGS. 3A and 3B. Hence, the charging system 226 includes a fluid 228, such as air or a dielectric liquid, surrounding the micro object 200 and a planar electrode array 230 comprising a plurality of electrodes 232, 234 driven by one or more voltage sources 236, 238. While not necessary, adjacent electrode pairs can be driven by voltage sources of opposite polarity, as illustrated. The charging system 226 further includes an insulator 241 positioned between the micro object 200 and the electrode array 230.

Figure 7:
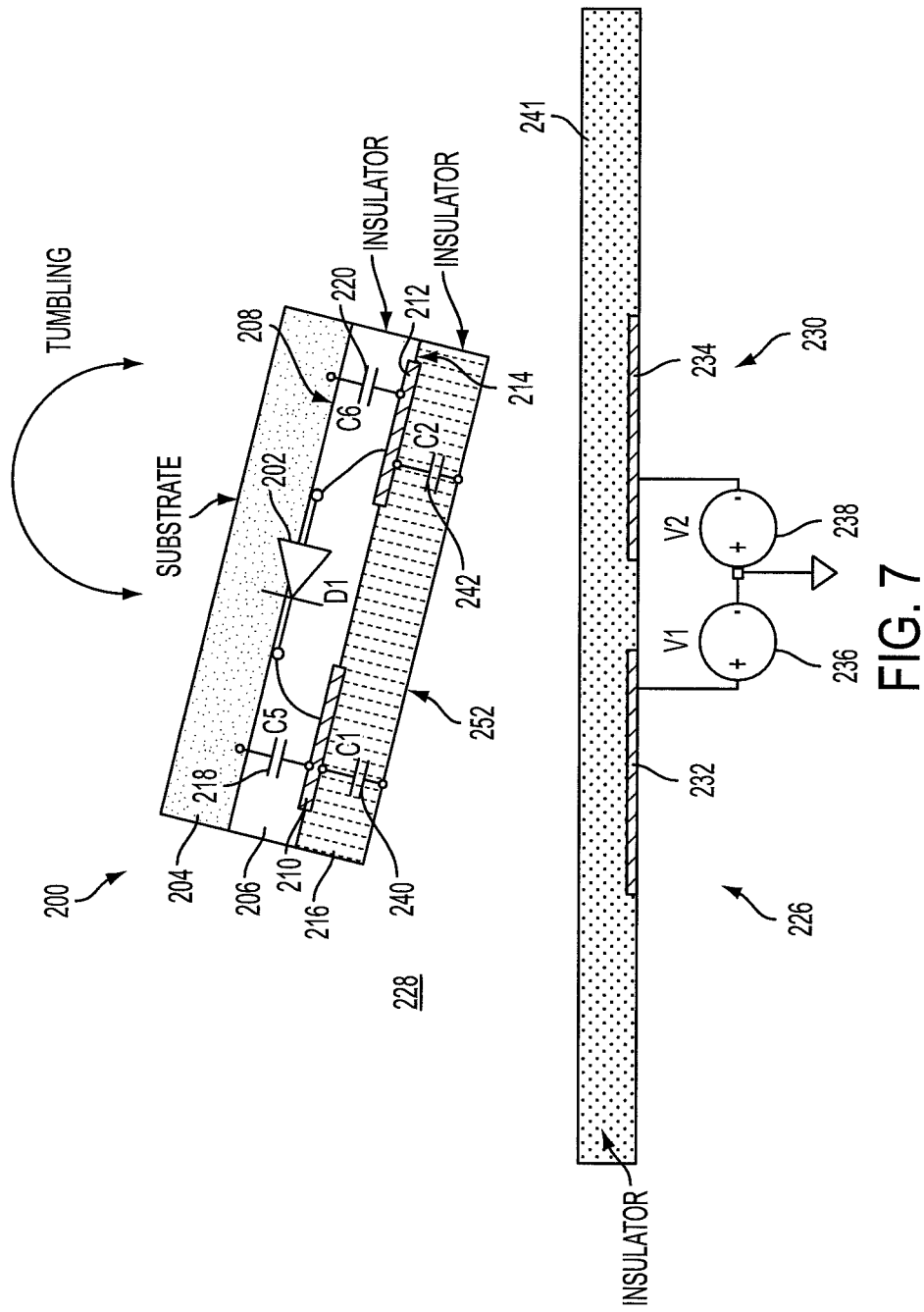
FIG. 7 illustrates a micro object patterned using a static electric field.

When patterning the micro object 200 using the electrode array 230, the micro object 200 is placed adjacent the electrode array 230. Subsequently, the voltage sources 236, 238 of the electrode array 230 drive the electrodes 232, 234 with charging signals to produce an alternating electric field relative to the micro object 200. The alternating electric field charges the micro object 200 by capacitive coupling. Capacitive coupling between the voltage sources 236, 238 and the coupling electrodes 210, 212 is modeled by capacitors 240, 242, 244, 246. The charging signals are typically alternating, such as AC, but can also be static, such as DC. When the charging signals are static, the micro object 200 moves (e.g., tumbling) relative to the electrode array 230, as illustrated in FIG. 7.

Figure 8:
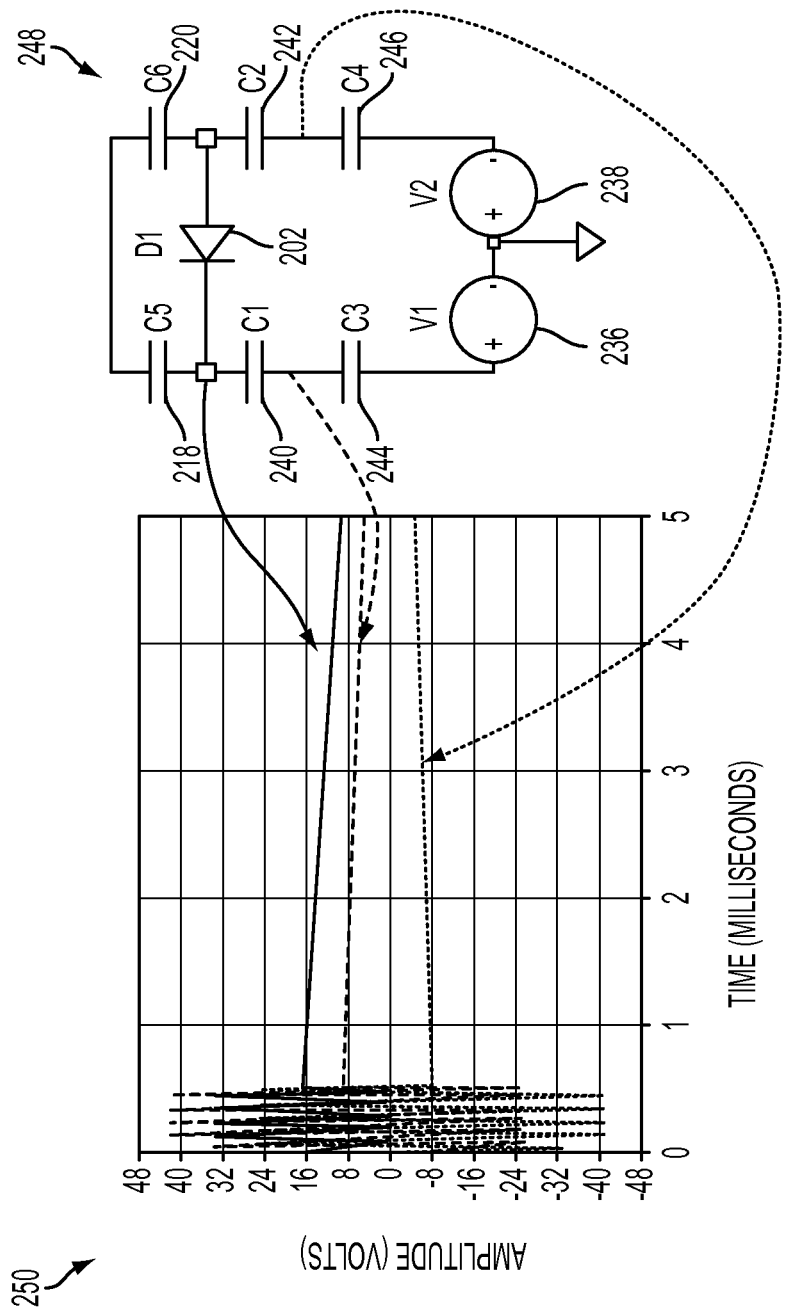
FIG. 8 illustrates a circuit representing FIG. 5, as well as a graph of the simulated surface potentials of multiple points in the circuit.

With further reference to FIG. 8, a circuit 248 representing the micro object 200 and the charging system 226 is illustrated. Capacitances of 10 femtofarads (fF) are used for the coupling capacitors 218, 220, 240, 242, 244, 246. Further illustrated is a graph 250 of the simulated surface potentials of multiple points in the circuit 248 during and after the electrode array 230 is driven by charging signals, each being a 5 cycle burst of 10 kilohertz (kHz) 50 volt (V) sine waves. These points include: 1) the point intermediate the first coupling capacitor 240, labeled as $C_1$, and the third coupling capacitor 244, labeled as $C_3$; 2) the point intermediate the second coupling capacitor 242, labeled as $C_2$, and the fourth coupling capacitor 246, labeled as $C_4$; and 3) the point at the anode of the rectifier 202, labeled as diode $D_1$. As can be seen through review of the graph 250, the charging signals are sufficient to charge the coupling capacitors 218, 220, 240, 242, 244, 246 to close to their equilibrium DC offset values.

After the first 0.5 milliseconds (ms) of a charging cycle, the voltage sources 236, 238, labeled as $V_1$ and $V_2$, return to zero. However, different electrostatic potentials of about +8V and −8V remain at distal ends of the external surface 252 of the micro object 200 through which the coupling electrodes 210, 212 capacitively couple to the voltage sources 236, 238. Further, stored charges of about plus and minus 160 femtocoulombs (fC) remain on the coupling electrodes 210, 212, respectively. Over time, the induced charge decays because of finite leakage current, mainly through the rectifier 202. Where the rectifier 202 is a diode (as illustrated), leakage is typically low enough that the induced charge can maintain at a substantial level many times longer than the charging signals. For example, for an on-off ratio of 10^6, typical of amorphous silicon diodes, the charge would decay to one half in approximately 250 seconds.

As known in the art, the induced charge Q of the coupling electrodes 210, 212 is related to capacitance C of the coupling electrodes 210, 212 and voltage V of the coupling electrodes 210, 212 by the following equation: Q=CV. By increasing the induced charge Q, the decay time and the amount of time the charge pattern persists can advantageously be increased. While numerous approaches exist for increasing the induced charge Q, one approach is to increase the voltage V by material selection of the substrate 204.

The voltage V can be roughly calculated as:

$$|V_1 + V_2| * \frac{\frac{1}{C_5} + \frac{1}{C_6}}{\sum_{i=1}^{6} C_i}, \quad (1)$$

where $V_1$, $V_2$, $C_1$, $C_2$, $C_3$, and $C_4$ are as described above, and $C_5$ and $C_6$ represent the fifth coupling capacitor 218 and the sixth coupling capacitor 220, respectively. Hence, the voltage V developed on the coupling electrodes 210, 212 increases as the fifth coupling capacitor 218 and the sixth coupling capacitor 220 become smaller. When the substrate 204 is formed from a conductive material, such as silicon (Si), as opposed to an insulating substrate, such as glass or sapphire, the fifth and sixth coupling capacitors 218, 220 are greater, whereby the voltage V is greater when the substrate 204 is insulating.

Figure 9:
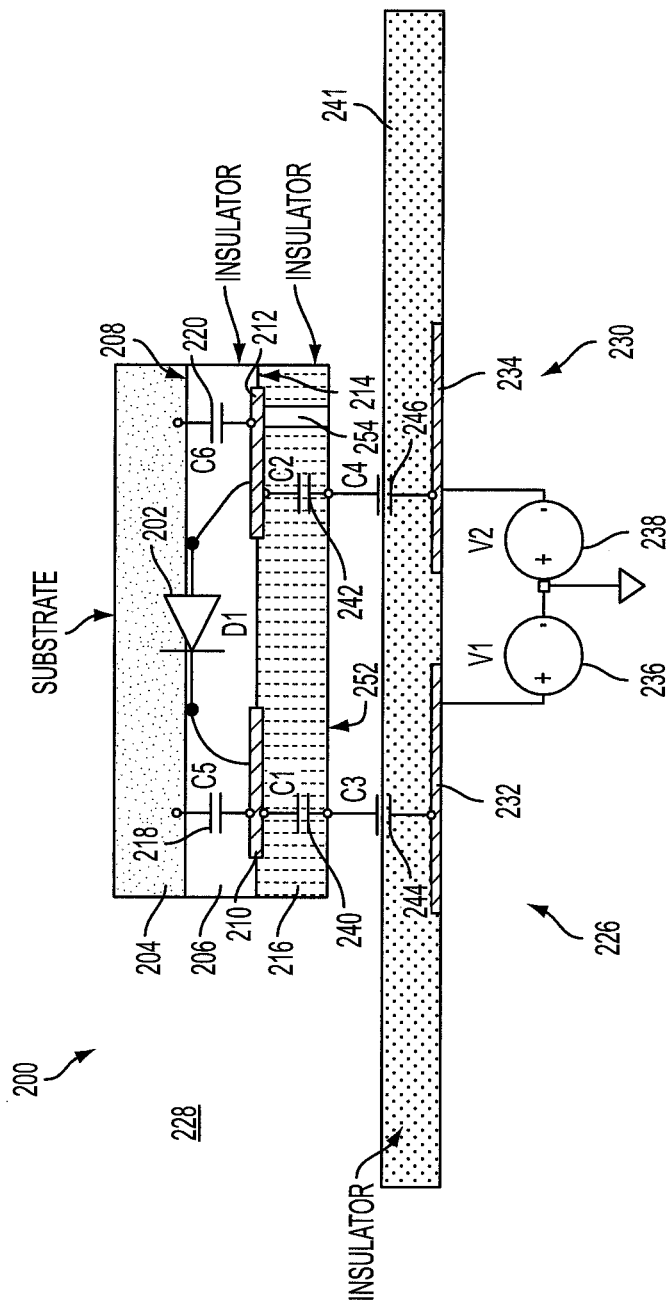
FIG. 9 illustrates a micro object within which a net charge can develop.

As shown in FIGS. 5-7, the coupling electrodes 232 are isolated from the surrounding environment by the second insulator 216. This advantageously minimizes the charge leakage path and increases the length of time the induced charge can be stored. However, charge conservation law also eliminates the possibility of inducing any net charge. FIG. 9 illustrates an embodiment of the micro object 200 that can result in a net induced charge. In contrast with the previous embodiments of the micro object 200, this embodiment includes the second insulator 216 and further includes a small opening 254 in the second insulator 216 allowing the external environment of the micro object 200 (e.g., a dielectric fluid carrying charge director molecules or other ions) to come in contact with one of the coupling electrodes 210, 212.

Figure 10:
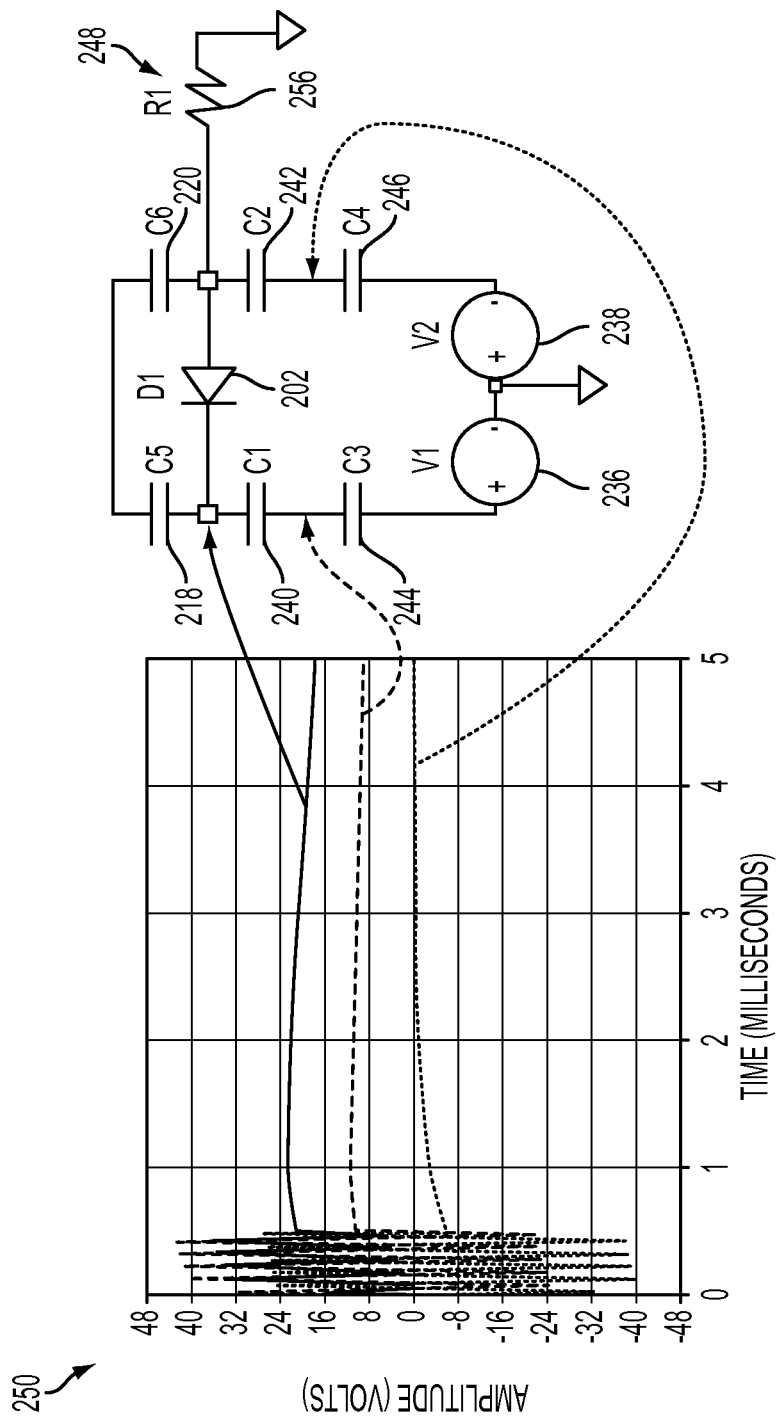
FIG. 10 illustrates a circuit representing FIG. 9, as well as a graph of the simulated surface potentials of multiple points in the circuit.

With reference to FIG. 10, an embodiment of the circuit 248 corresponding to FIG. 9 is provided. The circuit 248 includes a resistor 256, labeled as $R_1$, representing the small opening 254. The resistor 256 includes a high resistance of approximately 10^11 Ohms and extends from the adjacent electrode to ground. Further illustrated in FIG. 10 is an embodiment of the graph 250 corresponding to this embodiment of the circuit 248. As can be seen through review of the graph 250, after the first 0.5 ms of the charging cycle, the voltage sources 236, 238 return to zero. However, different electrostatic potentials of about +11V and −5V remain at distal ends of the external surface 252 of the micro object 200 through which the coupling electrodes 210, 212 capacitively couple to the voltage sources 236, 238. Further, a net charge of about 200 fC is stored on the coupling electrodes 236, 238.

Figure 11:
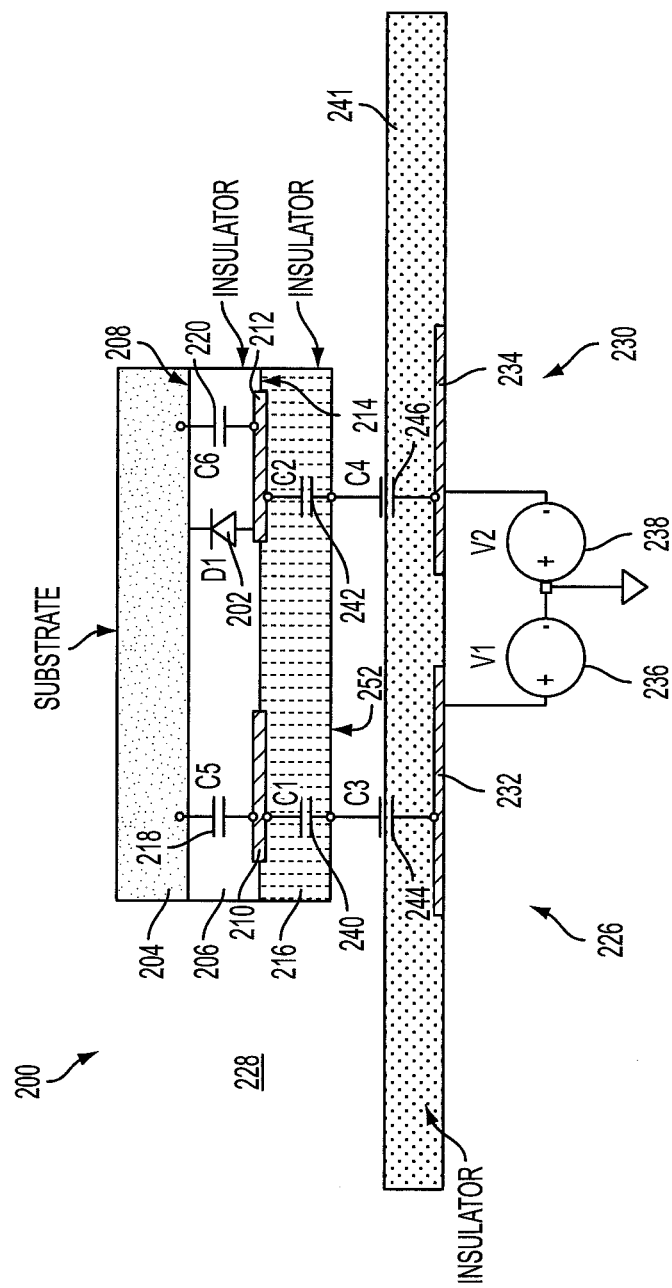
FIG. 11 illustrates a micro object patterned using a rectifying device extending between a coupling electrode and the substrate.

With reference to FIG. 11, another embodiment of the micro object 200 is illustrated. In contrast with the previous embodiments of the micro object 200, the substrate 204 is semi conductive. Further, the rectifying device 202 is connected between one of the electrodes 210, 212 and the substrate 204. The other electrode is left floating (i.e., not connected to the rectifying device 204).

Figure 12:
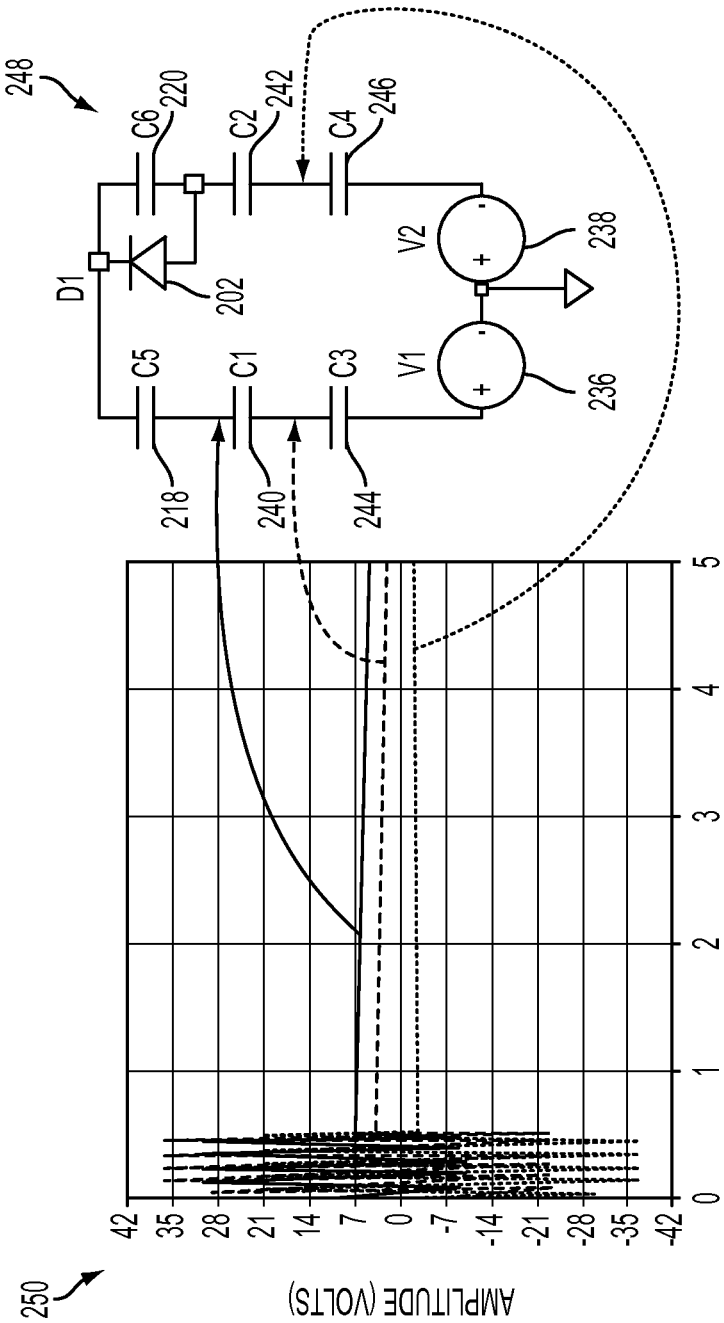
FIG. 12 illustrates a circuit representing FIG. 11, as well as a graph of the simulated surface potentials of multiple points in the circuit.

With reference to FIG. 12 an embodiment of the circuit 248 corresponding to FIG. 11, as well as embodiment of the graph 250 corresponding to this embodiment of the circuit 248, are provided. As can be seen through review of the graph, after the first 0.5 ms of the charging cycle, the voltage sources 236, 238 return to zero but different electrostatic potentials of about +3.5V and −3.5V remain at distal ends of the external surface 252 of the micro object 200 through which the coupling electrodes 210, 212 capacitively couple to the voltage sources 236, 238. Hence, the embodiment of the micro object 200 of FIG. 12 is less effective at charge build compared to the embodiment of the micro object 200 of FIG. 5. However, the embodiment of FIG. 12 may be easier to implement.

The foregoing embodiments of the micro object 200 illustrated different approaches to forming a simple dipole (i.e., two poles) on the external surface 252 of the micro object 200 through which the coupling electrodes 210, 212 capacitively couple to the voltage sources 236, 238. These approaches can be extended to create a complex charge pattern (i.e., more than two poles) on the external surface 252 by including a plurality of rectifier-electrode pairs, which can be overlapping. A rectifier-electrode pair is a pair of a rectifying device and one or more electrodes. Each rectifier-electrode pair includes a rectifying device either spanning between an electrode pair or spanning from an electrode to the substrate 204.

Figure 13:
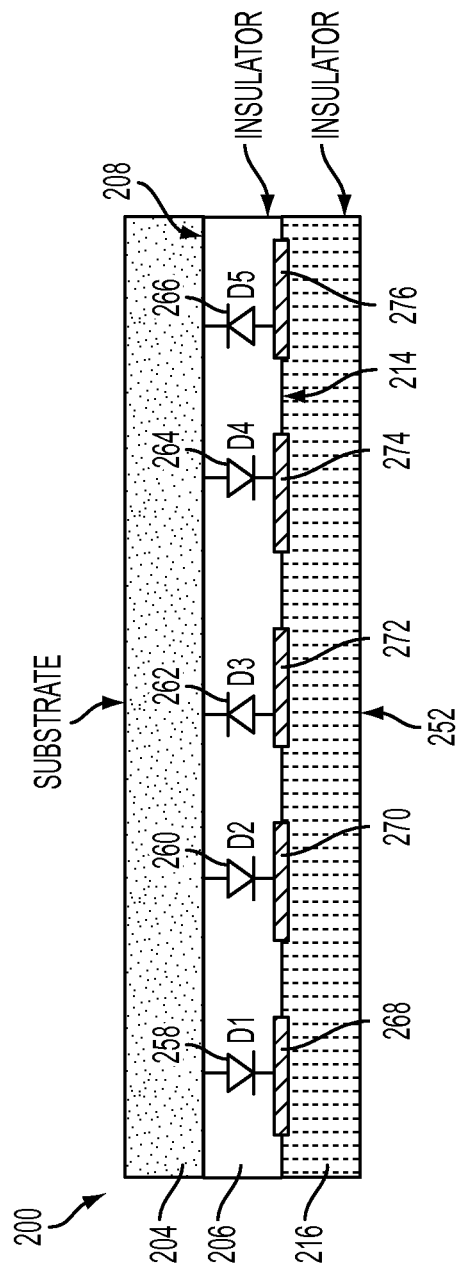
FIG. 13 illustrates a micro object that can develop a complex charge pattern.

With reference to FIG. 13, an embodiment of the micro object 200 that can develop a complex charge pattern is provided. The micro object 200 includes a plurality of rectifying devices 258, 260, 262, 264, 266 (illustrated as diodes). Each rectifying device 258, 260, 262, 264, 266 extends from a different electrode 268, 270, 272, 274, 276 to the substrate 204, which is necessarily conductive or semi conductive. In other words, the micro object 200 includes a plurality of rectifier-electrode pairs, each pair being a pair of a rectifying device and a single electrode. To change the charge contributed to the external surface 252 by one of the rectifying devices 258, 260, 262, 264, 266, the bias of the rectifying devices can be changed. Advantageously, this embodiment of the micro object 200 offers a high degree of flexibility in terms of designing the charge pattern.

Figure 14:
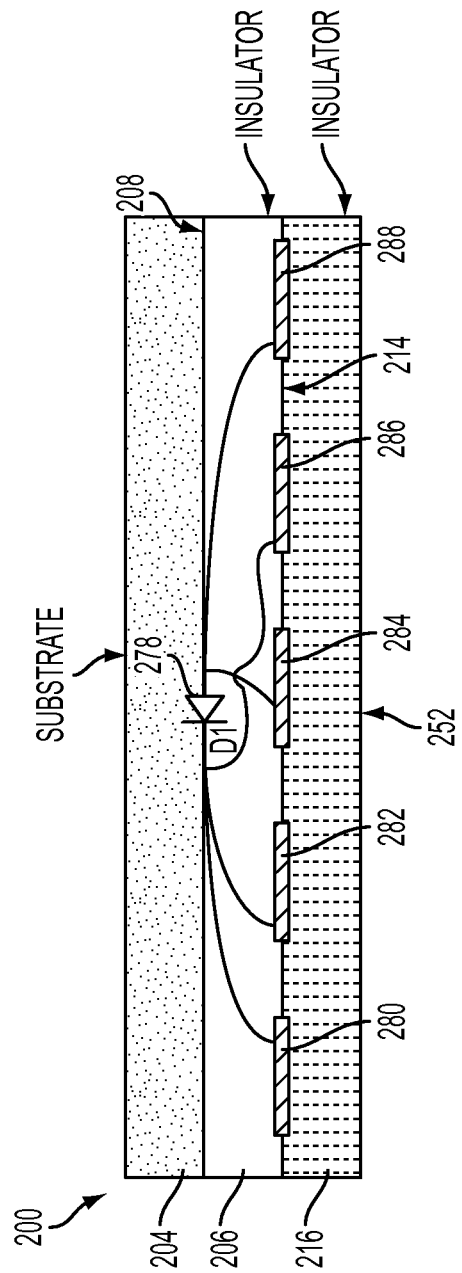
FIG. 14 illustrates another micro object that can develop a complex charge pattern.

With reference to FIG. 14, another embodiment of the micro object 200 that can develop a complex charge pattern is provided. The micro object 200 includes a single rectifying device 278 paired with a plurality of electrodes 280, 282, 284, 286, 288, 290. In other words, the micro object 200 includes a plurality of overlapping, but unique, rectifier-electrode pairs, each pair being a pair of the rectifying device 278 and an electrode pair. Advantageously, this embodiment of the micro object 200 minimizes the number of active devices (i.e., rectifying devices) needed.

The foregoing embodiments of the micro object 200 dealt with forming a charge pattern on the external surface 252 through which the coupling electrodes capacitively couple to the voltage sources 236, 238. However, the previously described approaches to forming a charge pattern can be extended to create charge patterns that span opposing external surfaces of the micro object 200.

Figure 15:
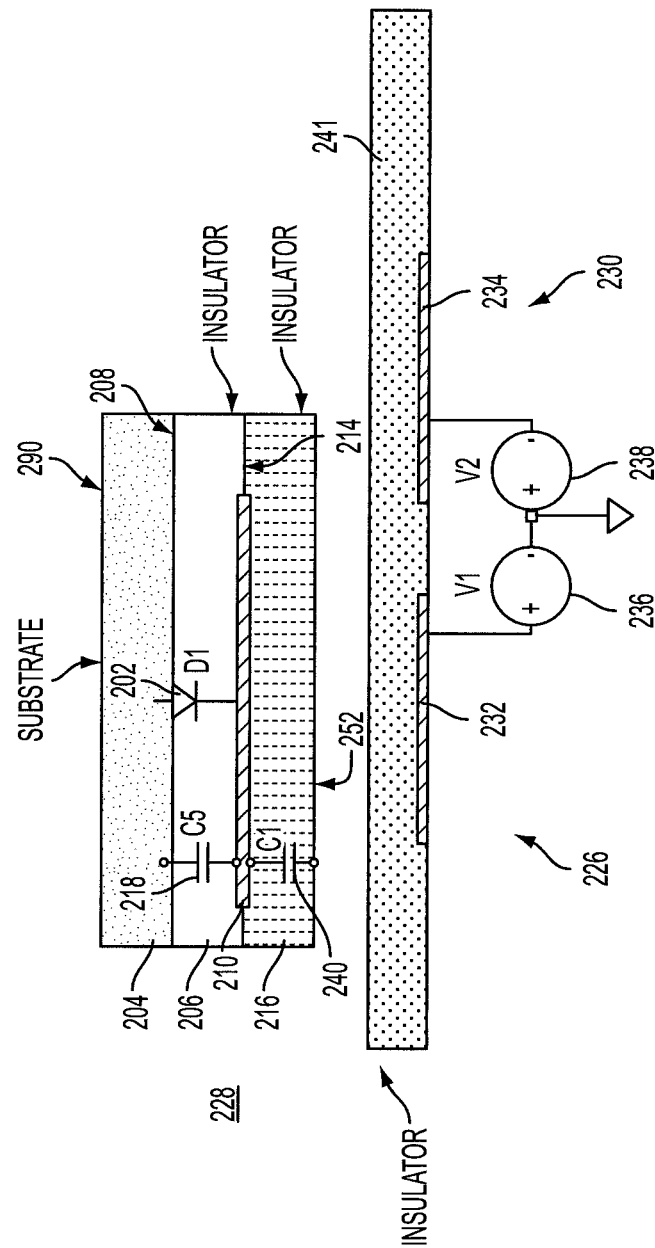
FIG. 15 illustrates a micro object patterned across opposing external surfaces.

With reference to FIG. 15, an embodiment of the micro object 200 patterned across opposing external surfaces 252, 290 is provided. In contrast with the embodiment of the micro object 200 of FIG. 5, this embodiment of the micro object 200 includes only the first electrode 210 and the rectifying device 202 is connected between the electrode 210 and the substrate 204, which is necessarily conductive or semi conductive. After charging, the micro object 200 includes a first charge on the external surface 252 of the micro object through which the micro object 200 capacitively couples to the voltage sources 236, 238. Further, the micro object 200 includes a second charge on the opposing external surface 290 of the micro object 200. Hence, a charge pattern along the thickness of the micro object 200 (i.e., the Z direction) is created, which can be useful for aligning the micro object 200 facing up or facing down.

Figure 16:
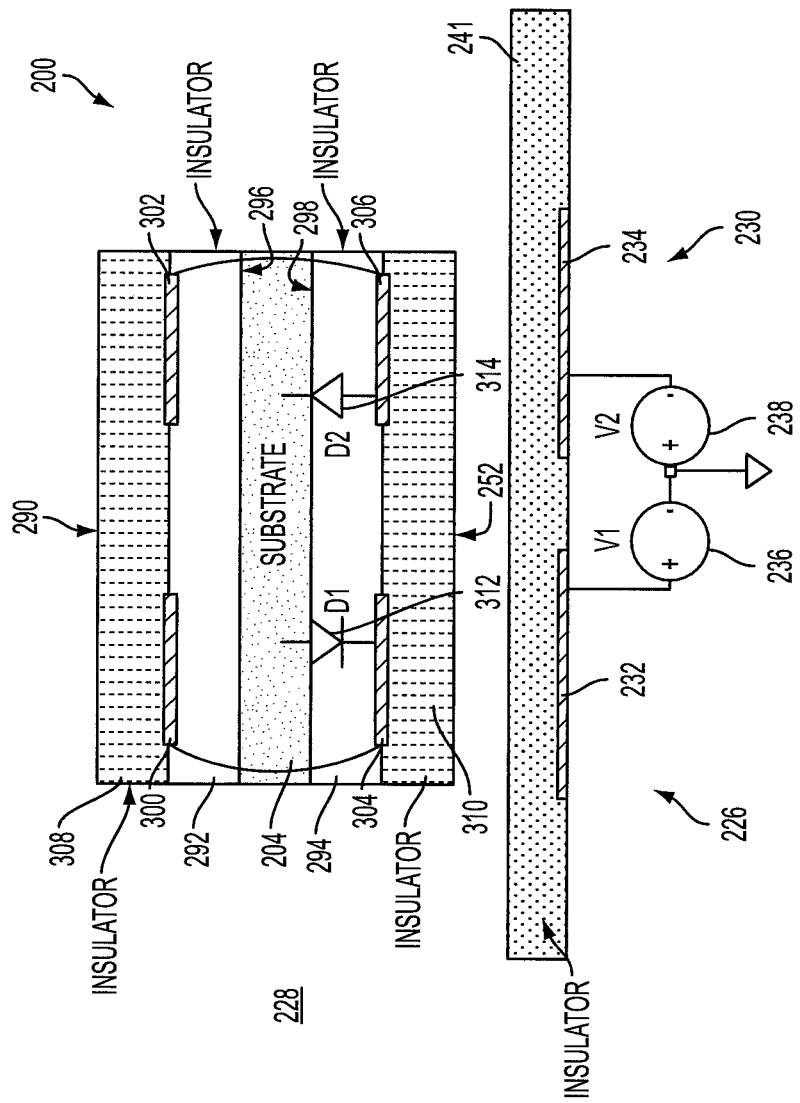
FIG. 16 illustrates another micro object patterned across opposing external surfaces.

With reference to FIG. 16, another embodiment of the micro object 200 patterned across opposing external surfaces 252, 290 is provided. The micro object 200 includes the substrate 204, two insulators 292, 294 adjoining opposite sides 296, 298 of the substrate 204, two coupling electrodes 300, 302, 304, 306 adjoining each of the two insulators 292, 294 opposite the substrate 204, and two optional second insulators 308, 310 adjoining the two insulators 292, 294 around and over the coupling electrodes 300, 302, 304, 306. Each coupling electrode 300, 302, 304, 306 is connected with another electrode 300, 302, 304, 306 on an opposite side of the substrate 204 and a common side of the micro object 200. The micro object 200 further includes two oppositely biased rectifying devices 312, 314, each connected from a different coupling electrode 304, 306 on a common side of the substrate 204 to the substrate 204, which is conductive or semi conductive.

After charging the micro object 200, the micro object 200 includes a dipole on the external surface 252 of the micro object 200 through which the coupling electrodes 300, 302, 304, 306 are capacitively coupled to the voltage sources 236, 238. Further, the micro object 200 includes a second dipole on the opposite external surface 290 of the micro object 200. Hence, the micro object 200 includes dipoles on opposing external surfaces 252, 290. More complex charge patterns can be created in accordance with the teachings of this embodiment by including additional coupling electrodes and rectifying devices, similar to the embodiment of FIG. 11.

The foregoing embodiments of the micro object 200 dealt with binary charge patterns (i.e., charge patterns of positive and negative charge of fixed quantities). Charge patterns comprised of a range of charges beyond just positive and negative fixed quantities can be employed by laterally varying the thickness of the insulators and/or by varying the area of the coupling electrodes.

Figure 17:
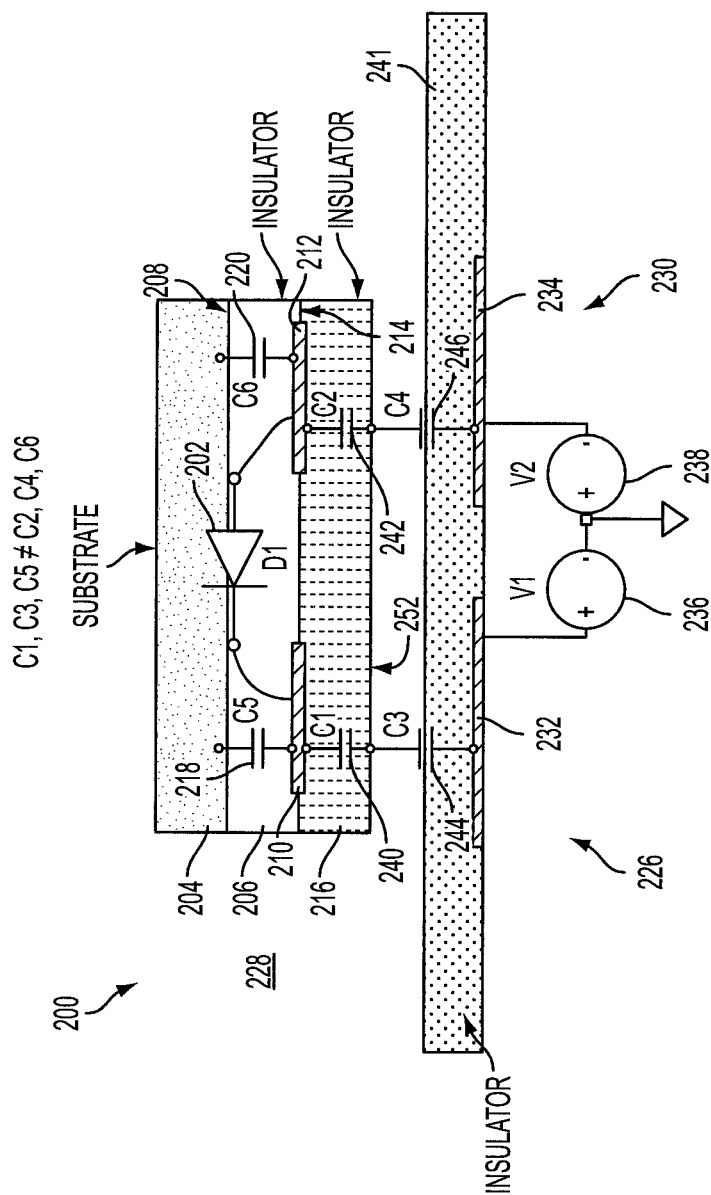
FIG. 17 illustrates a micro object patterned with a range of charges beyond positive and negative.

With reference to FIG. 17, an embodiment of the micro object 200 patterned with a range of charges beyond positive and negative is provided. The micro object 200 is the same as the embodiment of FIG. 5 except that the coupling electrodes 210, 212 vary in area. By varying the area of the coupling electrodes 210, 212, the capacitances of the coupling capacitors 218, 220, 240, 242, 244, 246 vary. Namely, the coupling capacitors 218, 240, 244 of the first coupling electrode 210 are different than the coupling capacitance of 220, 242, 246 of the second coupling electrode 212.

Figure 18:
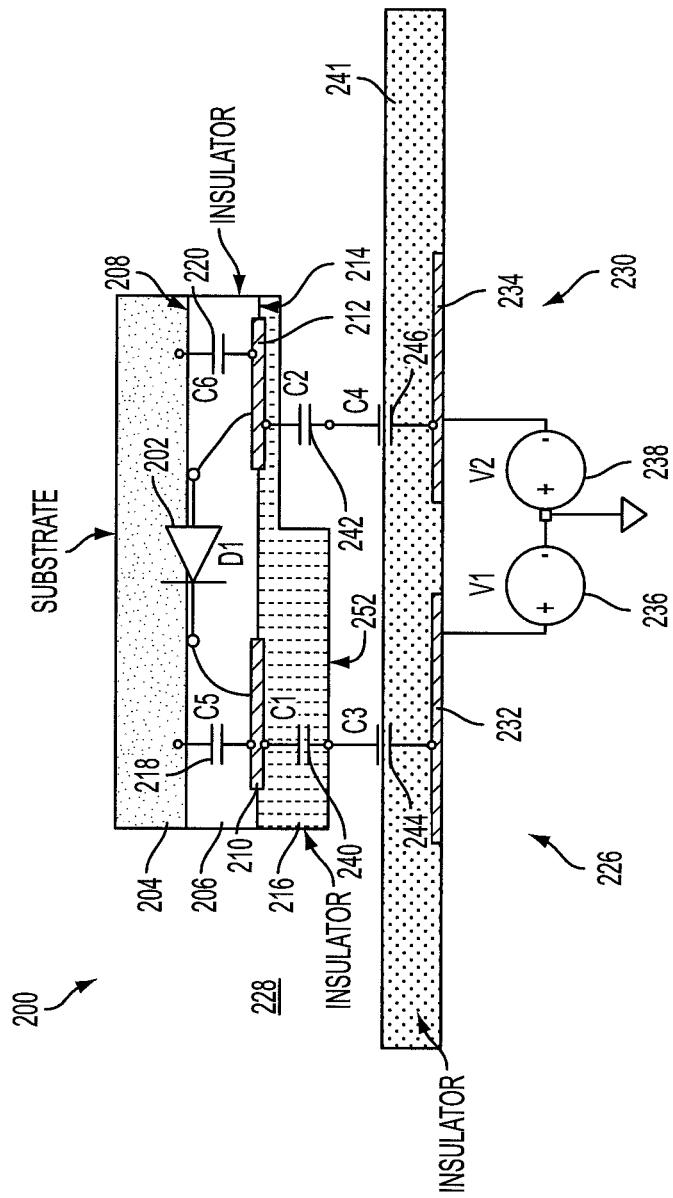
FIG. 18 illustrates another micro object patterned with a range of charges beyond positive and negative.

With reference to FIG. 18, another embodiment of the micro object 200 patterned with a range of charges beyond positive and negative is provided. The micro object 200 is the same as the embodiment of FIG. 5 except that the thickness of the second insulator 216 varies laterally. Similar to varying the area of the coupling electrodes 210, 212, varying the thickness of the second insulator 216 varies the capacitances of the coupling capacitors 218, 220, 240, 242, 244, 246. Hence, the coupling capacitors 218, 240, 244 of the first coupling electrode 210 are different than the coupling capacitance of 220, 242, 246 of the second coupling electrode 212.

The foregoing embodiments of the micro object 200 conceptually illustrated the rectifying devices 202, 258, 260, 262, 264, 266, 278, 312, 314 as diodes. Any number of well-known approaches to forming diodes can be employed. However, two embodiments of a diode 316 are described in FIGS. 19 and 20.

Figure 19:
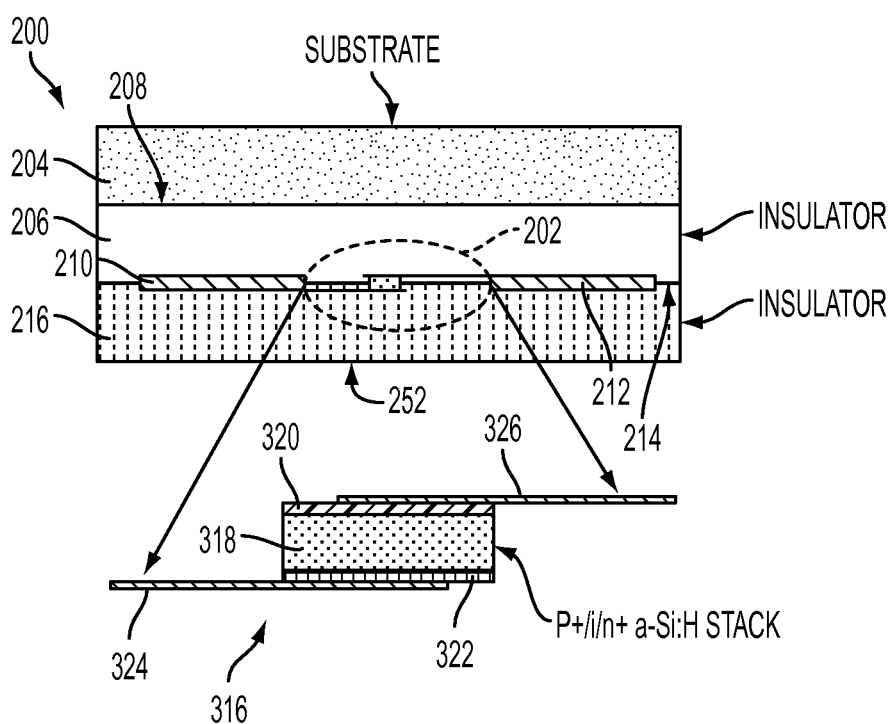
FIG. 19 illustrates a diode within a micro object.

With reference to FIG. 19, an embodiment of the diode 316 is illustrated as the rectifying device 202 of the embodiment of the micro object 200 of FIG. 5. According to this embodiment of the diode 316, the diode 316 is created using thin film (e.g., fractions of a nanometer to several micrometers thick) electronic technology. As illustrated, the diode 316 is the well-established a-Si:H PIN diode structure, but other thin film electronic technologies can be used, such as printed organic diodes, Schottky diodes formed with metal and a thin film semiconductor material, such as indium-gallium-zinc oxide (InGaZnO), copper oxide (CuO), cadmium selenide (CdSe), gallium indium zinc oxide (GIZO), or some other semiconducting metal oxide or polymeric material. The diode 316 includes an insulator 318 with a p-type semiconductor 320 and an n-type semiconductor 322 on opposite sides. Further, the coupling electrodes 210, 212 are connected to the semiconductors 320, 322 by conductors 324, 326.

Figure 20:
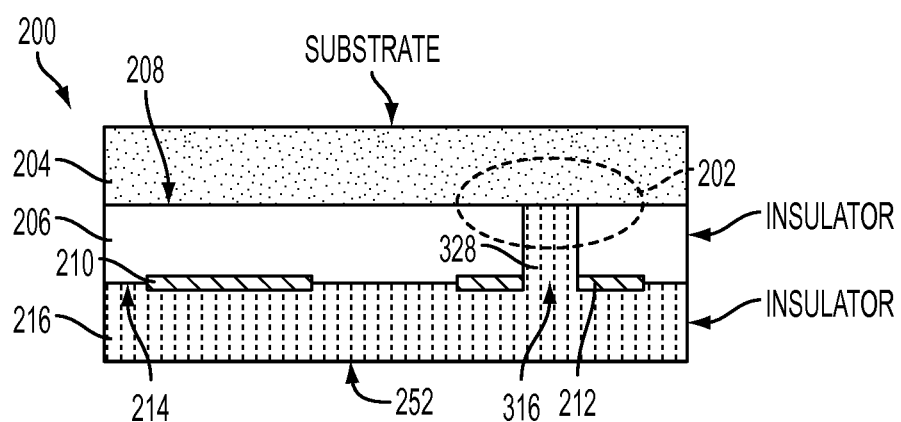
FIG. 20 illustrates another diode within a micro object.

With reference to FIG. 20, another embodiment of the diode 316 is illustrated as the rectifying device 202 of the embodiment of the micro object 200 of FIG. 11. According to this embodiment of the diode 316, a via 328 through the insulator 206 connects one of the coupling electrodes 212 to the substrate 204, which is often semi conducting. Where the substrate 204 is semi conducting, the diode 316 can be formed on the substrate 204 (e.g., using the a-Si:H PIN diode structure) or formed by contacting the substrate 204 with the coupling electrode 212 (i.e., a simple Schottky diode), as illustrated.

The previous embodiments of the micro object 200 and the diode 316 are not intended to be exhaustive. Rather, the previous embodiments are intended to illustrate the different design decisions that can be made when designing the micro object 200. Such design decisions include determining whether the micro object 200 is to include a simple charge pattern (e.g., as shown in FIG. 5) or a complex charge pattern (e.g., as shown in FIG. 13). When a simple charge pattern is desired, the micro object 200 includes a single rectifier-electrode pair. When a complex charge pattern is desired, the micro object 200 includes a plurality of rectifier-electrode pairs. The design decisions further include determining the location of charge buildup on the micro object 200 (c.f., FIG. 5 and FIG. 15).

For each rectifier-electrode pair, a determination is made as to: 1) whether the rectifying device should include one or more active devices (c.f., FIG. 5 and FIG. 6); 2) whether the rectifying device should extend between coupling electrodes (e.g., as shown in FIG. 5) or between a coupling electrode and the substrate 204 (e.g., as shown in FIG. 11); 3) whether a coupling electrode should be exposed to the external fluid (e.g., as shown in FIG. 9); 4) whether the charge should include only positive or negative charge (e.g., as shown in FIG. 15) or a range of charge (e.g., as shown in FIG. 17); and 5) the design of the rectifying devices, examples of which are shown in FIGS. 19 and 20.

Advantageously, the foregoing approaches to using rectifying devices for patterning micro objects can be more predictable and reliable compared to other charging mechanisms. The foregoing approaches are based on simple circuit techniques and remove the vagaries of chemical charge formation, micelle formation, and so on. The foregoing approaches to using rectifying devices also allow the use of pure dielectric fluids or air as the surrounding medium. This has the advantage of long Debye lengths, removal of field decay from ion transport and screening, and low sensitivity to moisture.

Referring back to the high level system 10 and method 12 of FIG. 1, after the micro objects 16 (also identified herein as micro objects 102, 152, 200) are individually encoded 20 with patterns, the micro objects 16 are positioned and oriented 22 on a final substrate by a manipulation system.

The manipulation system varies force fields, such as electric or magnetic fields, in both space and time to move the micro objects 16. As should be appreciated, magnetic or electric poles of like polarity repel, whereas magnetic or electric poles of opposite polarity attract. On this basis, generating and/or moving corresponding patterns of the micro objects 16 allows the micro objects 16 to be selectively manipulated. A corresponding pattern of a micro object describes the opposite pattern (i.e., opposite of each pole) of the micro object and hence attracts the micro object. In some embodiments, depending upon the approach used to pattern the micro objects 16, the same system can be employed to both pattern the micro objects 16 and move the micro objects 16 to the desired position and orientation.

Any number of well-known approaches can be employed to move the micro objects 16. When the micro objects 16 are charge patterned, an array of electrodes is typically employed. For example, with reference to FIGS. 3A and 3B, the system 100 described therein can additionally or alternatively be employed to move the micro objects 16 using the planar array 106 with electrodes. When the micro objects 16 are magnetically patterned, an array of coils (e.g., an array of wire windings) is typically employed. For example, with reference to FIGS. 3A and 3B, the system 100 described therein can additionally or alternatively be employed to move the micro objects 16 using the planar array 106 with coils.

Where the system 100 of FIGS. 3A and 3B is employed as a manipulation system, a micro object 102 is placed adjacent the planar array 106 within the fluid 104 before movement of the micro object 102. When the micro object is charge patterned, as opposed to magnetically patterned, the fluid is typically a dielectric fluid (e.g. Isopar) with a small amount of surfactant added (e.g. docusate sodium (AOT)) to increase the electrical conductivity of the fluid 104. Further, before movement of the micro object 102, the power sources 110 can optionally drive the planar array 106 with charging signals to charge or recharge the micro object 102. Subsequent to placing the micro object 102 in the fluid 104 and assuming the micro object 102 is charged, the power sources 110 drive the electrodes or coils 108 with manipulation signals to move the micro object 102. The manipulation signals can, for example, move the micro object 102 to its selected location by moving the corresponding pattern complementary to the pattern on the micro object 102 across the substrate 112.

Figure 21:
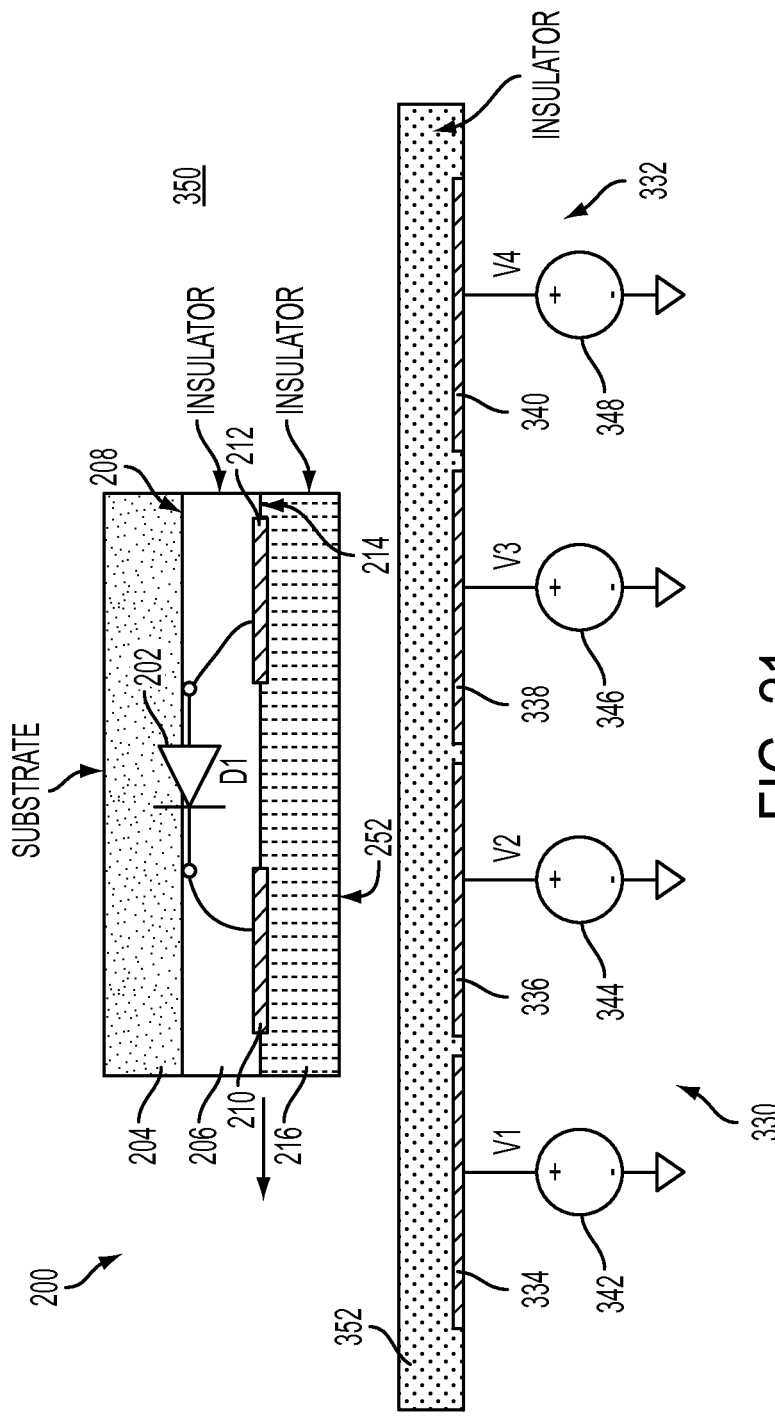
FIG. 21 illustrates movement of a micro object using an electrode array to generate an electric field.

With reference to FIG. 21, movement of the embodiment of the micro object 200 of FIG. 5 is illustrated. Other embodiments of the micro object 200 can similarly be moved. Movement of the micro object 200 is performed by a manipulation system 330 using an electrode array 232 comprised of a plurality of electrodes 334, 336, 338, 340, each controlled by a voltage source 342, 344, 346, 348. Before movement of the micro object 200, the micro object 200 is placed in a dielectric fluid 350 adjacent the electrode array 232 and separated from the electrode array 232 by an insulator 352. Further, the micro object 200 is optionally charged or recharged using the electrode array 232. Thereafter, the electrode array 232 is driven to move the micro object 200 to the left.

Figure 22:
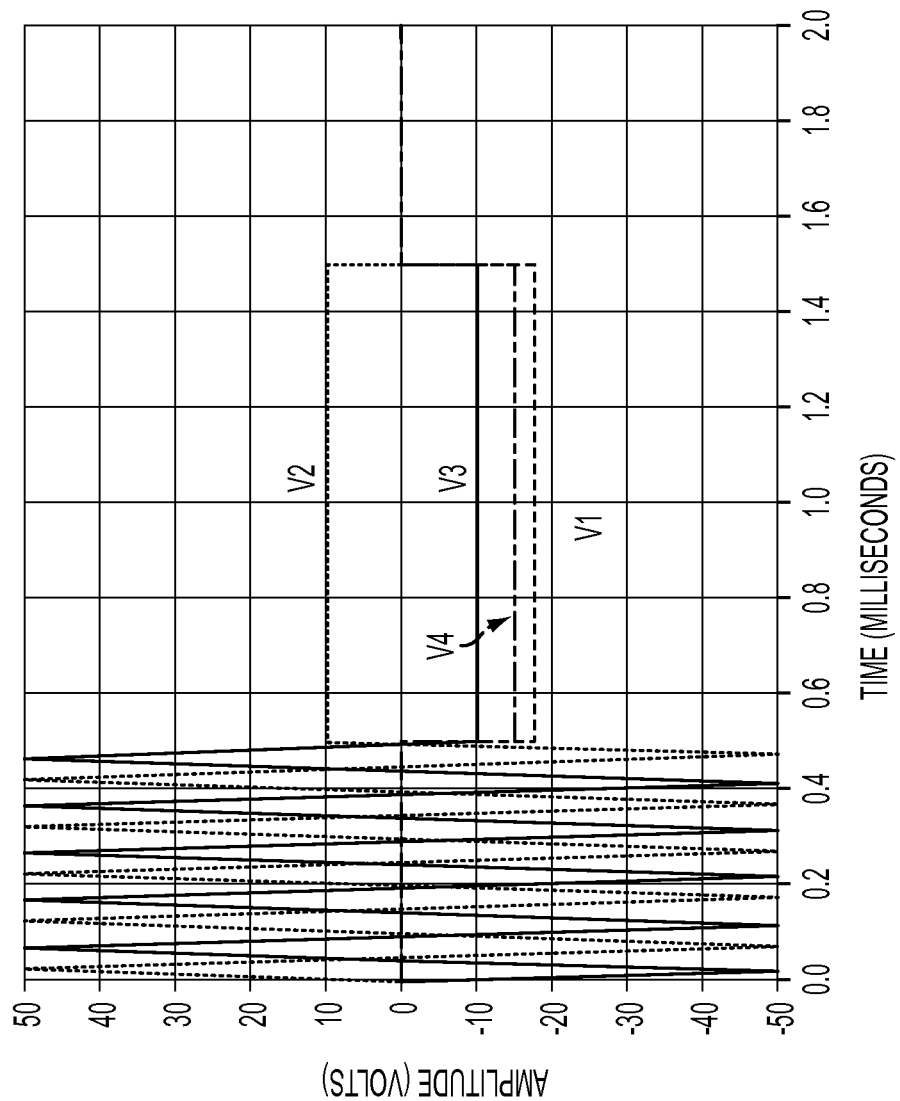
FIG. 22 illustrates the signals driving the electrode array of FIG. 21.
Figure 23:
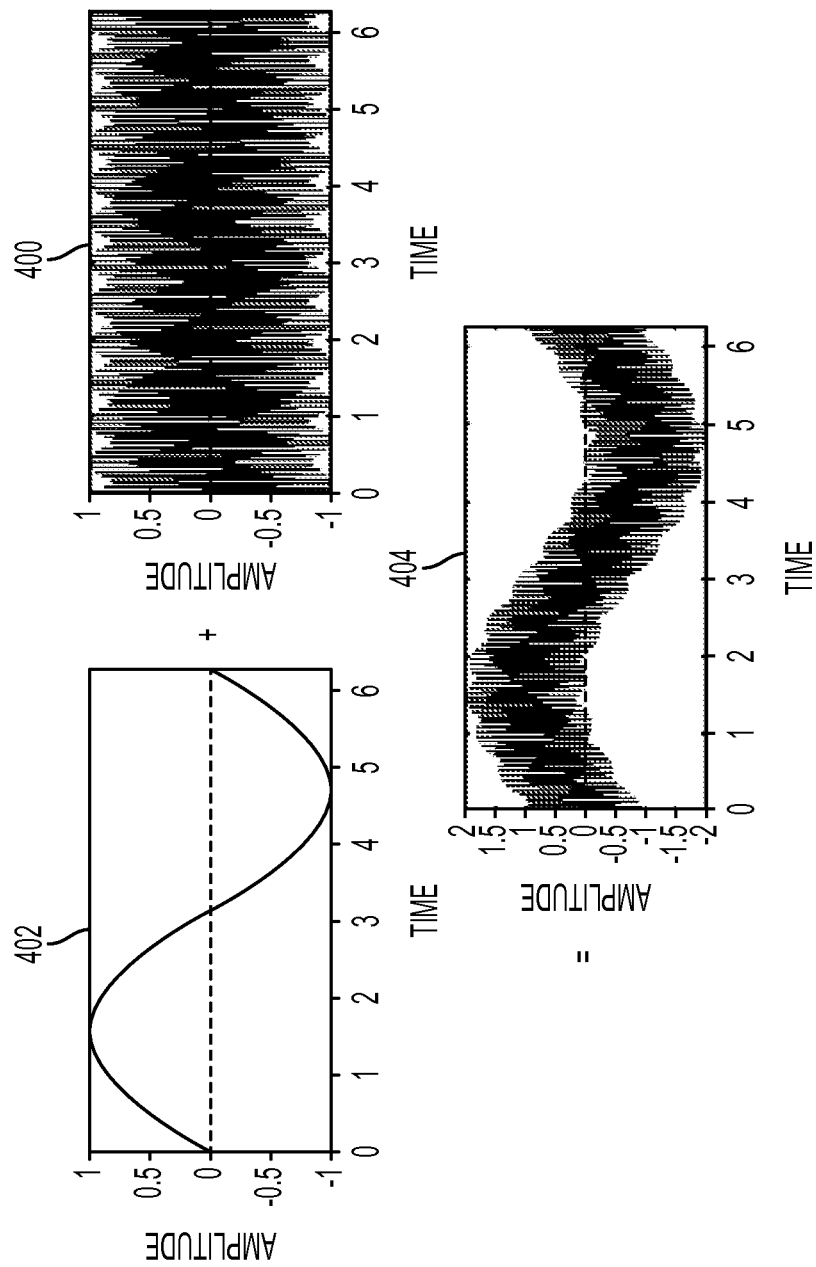
FIG. 23 illustrates superimposing a high frequency driving force over a low frequency manipulation force to generate a composite force.

FIG. 22 provides an example of the signals that can be produced by the voltage sources 342, 344, 346, 348 to move the micro object 200 to the left. These signals include both charging signals and manipulation signals. During the first 0.5 ms, charging signals charge or recharge the micro object 200 using a 5 cycle burst of approximately 10 kHz 50 V sine waves. As should be appreciated, this is the charging signal described above for charging micro objects employing rectifiers. After charging, manipulation signals move the micro object 200 on the surface of the insulator 352 to the left.

Referring back to FIG. 1, accurate movement of the micro objects 16 is important to generating the micro assemblies 14. However, a challenge with accurately moving objects over a surface, such as a substrate, is overcoming stiction. Stiction is the difference between the coefficient of static friction, and dynamic friction, resulting from the intermolecular forces between the two surfaces in contact. When attempting to move a micro object in the presence of stiction, the forces required to initiate motion are often significantly greater than the forces required to maintain motion. As a result, attempts at fine control over the position of a micro object subject to stiction often result in ringing, overshoot and instabilities in position control.

A solution to overcoming stiction is to apply a high frequency driving force (e.g., a high frequency, periodic driving force) to the micro objects 16. The frequency of the driving force is high (e.g., a magnitude greater) compared to the frequency of the desired net motion (i.e., the desired speed). The amplitude of the driving force is chosen so that the peak force is sufficient to overcome stiction, and the frequency of the driving force is chosen so that the displacement of a micro object during one cycle is less than the desired assembly precision.

This solution can be applied to obtain precise control over the motion of the micro objects 16 during manipulation by superimposing a high frequency driving force 400 over a low frequency manipulation force 402 to generate a composite force 404. The frequency of the manipulation force is low compared to the frequency of the driving force. The manipulation force 402 is spatially programmable in that it can be programmatically moved to move micro objects. The composite force is then applied to the micro objects 16 as an electric or magnetic field using a field generator. For example, a voltage representation of the composite force can be applied to the planar array 106 of FIGS. 3A and 3B by the power sources 110 of FIGS. 3A and 3B.

In some embodiments, the frequency and amplitude of the driving force are chosen to only partially overcome stiction related forces so the manipulation force is also needed to move the micro objects 16. In such embodiments, the frequency and amplitude are typically chosen so that when the manipulation force is superimposed, the dynamics of the micro objects 16 are altered to increase or decrease the effective amount of damping.

Figure 24:
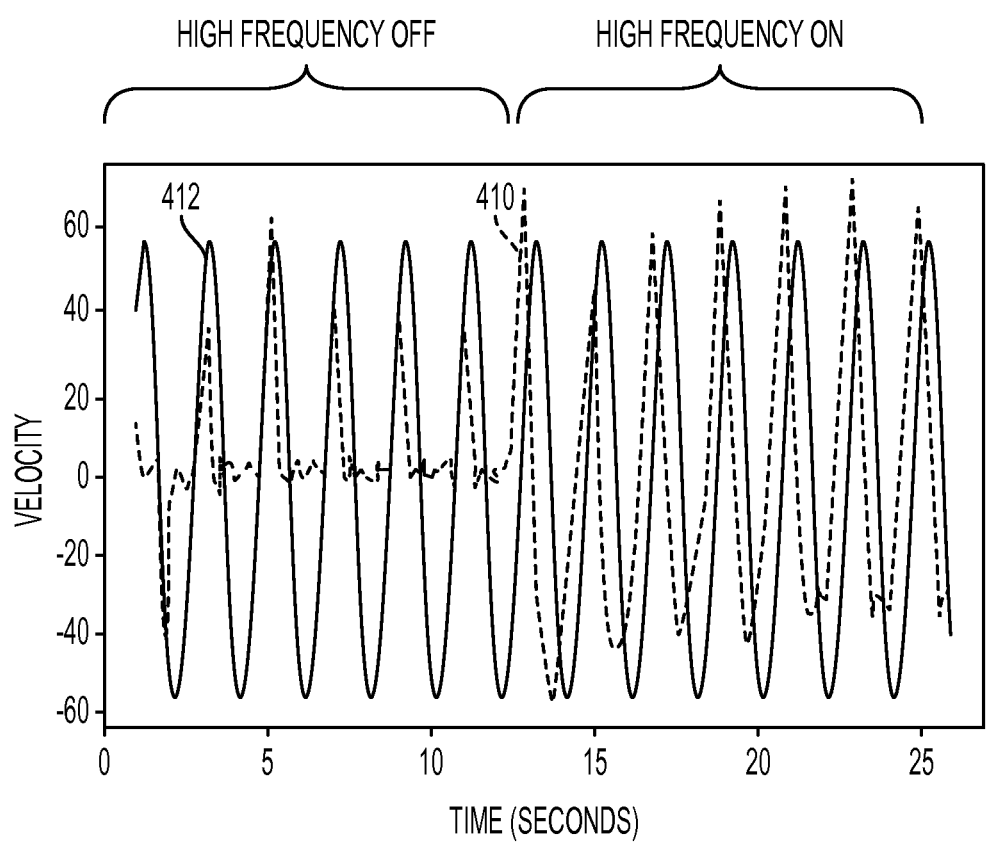
FIG. 24 illustrates the effect of superimposing a driving force on a manipulation force.

With reference to FIG. 24, the effect of a driving force is illustrated. The dark curve 410 represents a manipulation force as a 150 V sinusoidal voltage waveform at a frequency of 0.5 hertz (Hz). The manipulation force moves a micro object back and forth between two electrodes. The other curve 412 is the measured velocity of a micro object in response to the composite force. During roughly the first 12 seconds, only the manipulation force is applied. Thereafter, at approximately 12 seconds, a driving force is superimposed over the manipulation force. The driving force is represented as a 150 V sinusoidal voltage waveform at a frequency of 330 Hz. As can be seen, without the driving force, the micro object only moves when the manipulation force is high (i.e., the amplitude is high). In contrast, with the driving force, the velocity of the micro object tracks the composite force except for a phase lag. The phase lag is present due to the capacitive coupling between the drive electrodes and the dielectric fluid within which the micro object is positioned.

Referring back to FIG. 1, during manipulation of the micro objects 16, the driving force can be globally controlled for all of the micro objects 16 or locally controlled to selectively alter the mobility of individual micro objects. For example, where a micro object has already been moved to its predetermined assembly location, the micro object can be reversibly lock in place by not applying the driving force to the micro object. When the manipulation force is applied using an array or coils or electrodes, this can be achieved by suppressing application of the driving force to electrodes proximate the micro objects to be reversibly locked.

Further, during manipulation of the micro objects 16, net motion of the micro objects 16 can be achieved by a combination of a periodic manipulation force and a driving force. In some embodiments, the driving force can be applied as a step change in force, as a short step pulse, briefly before application of a manipulation force, or during part of a cycle of a manipulation force. Further, in some embodiments, the driving force can be integrated with the manipulation force. That is to say, the manipulation force includes components during part of its cycles that represent the driving force.

One example of achieving net motion is to apply a manipulation force with a periodic field to the micro objects 16 and superimpose a driving force during only part (e.g., half) of a cycle of the manipulation force. Another example of achieving net motion is to apply asymmetric periodic force to the micro objects 16, such as a saw tooth waveform. One cycle of a saw tooth waveform consists of a step increase in force, followed by a linear ramp down back to the initial force. The step increase contains high frequency components that reduce stiction resulting in motion. If the ramp back down to the initial force is slow enough, the micro objects stick onto the surface again.

The driving force can be applied by a field generator to micro objects using any approach to generating an electric or magnetic field. However, an array of electrodes or coils driven by a voltage representation of the driving force is typically employed. An electrode array can be employed to generate the driving force as an electric field, and a coil array can be employed to generate the driving force as a magnetic field. The electrode array can be formed of traditional electrodes or photosensitive electrodes, as described in connection with FIGS. 3A and 3B. Where an array of coils or electrodes is employed to generate the driving force, the driving force can be applied to only to specific electrodes or coils that are proximate micro objects to be manipulated. Further, in some embodiments, the same coil or electrode can be employed to generate both the manipulation force and the driving force. Alternatively, in other embodiments, the manipulation force is generated by different coils or electrodes than the coils or electrodes generating the manipulation force.

The foregoing approaches to manipulating the micro objects 16 have thus far been limited to moving the micro objects 16 in electric or magnetic fields. There has been limited discussion on positioning and orienting the micro objects 16 on a final substrate. Even so, it is to be appreciated that, in some embodiments, the foregoing approaches to manipulating the micro objects 16 can be used exclusively to position and orient the micro objects 16 on the final substrate. For example, the final substrate can be insulating and positioned between the micro objects 16 and an electrode array. The electrode array then positions the micro objects using electric fields, as described above. In other embodiments, the micro objects 16 are moved to the final substrate through a combination of electric or magnetic fields, and mechanical force.

In some embodiments, the patterned micro objects 16 are positioned and oriented on a final substrate using both electric or magnetic fields, and mechanical force, according to U.S. patent application Ser. No. 12/754,245 (U.S. Patent App. Pub. No. 2010/0186221) for "Micro-Assembler", by Chow et al., filed Apr. 5, 2010, incorporated herein by reference. According to U.S. patent application Ser. No. 12/754,245, the micro objects 16 are first positioned and oriented on an intermediary substrate by charge or magnetic patterns encoded on the intermediary substrate using a planar electrode array permanently affixed to the intermediary substrate. Thereafter, the positioned and oriented micro objects 16 are mechanically transferred to the final substrate in a manner that preserves their relative positions and orientations.

Figure 25:
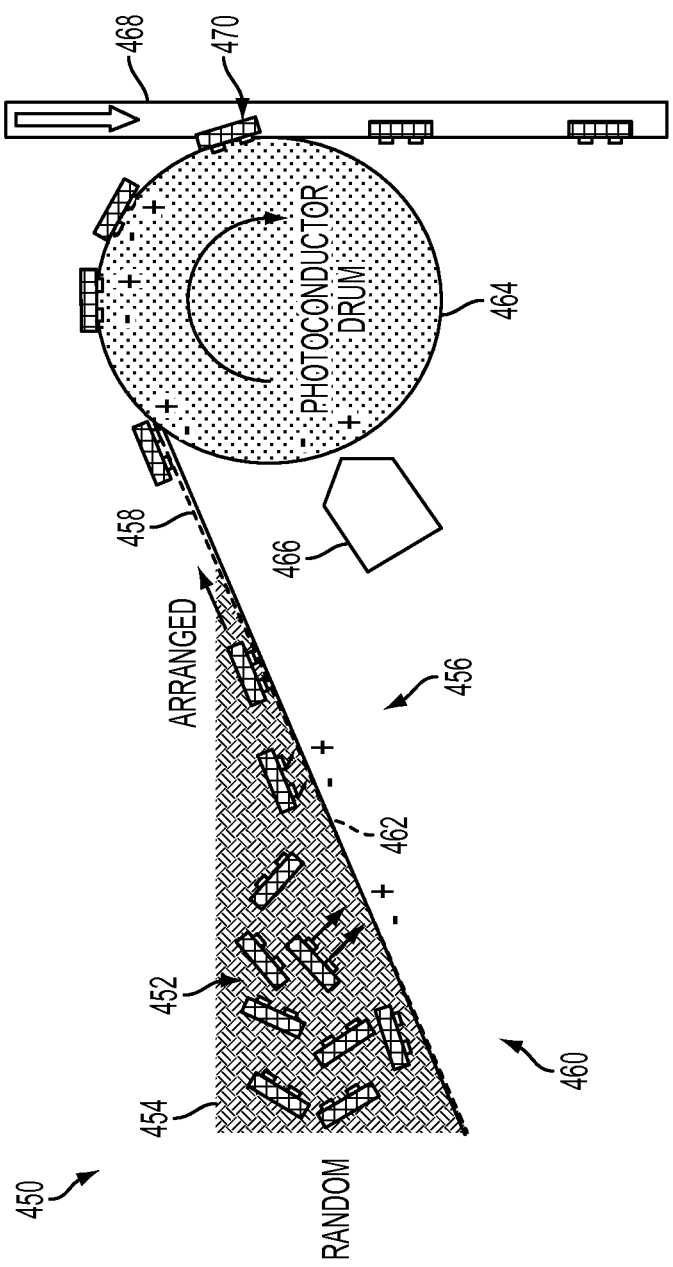
FIG. 25 illustrates a system for positioning and orienting micro objects on a final substrate using an intermediary substrate.

With reference to FIG. 25, a manipulation system 450 according U.S. patent application Ser. No. 12/754,245 is provided. As illustrated, patterned micro objects 452 are placed in a reservoir 454 where the micro objects 452 are stored prior to assembly. The reservoir 454 is typically a bath of fluid (e.g., a dielectric fluid with charged additives to allow finite conductivity) within which the micro objects 452 are randomly positioned and oriented. However, other approaches to storing the micro objects 452 prior to assembly are contemplated.

A transporter 456 receives micro objects from the reservoir 454 and transfers the micro objects away from the reservoir 454 using a traveling wave pattern created by electrodes on plate 458. The plate 458 is typically an insulator. While receiving the micro objects, the transporter 456 positions and orients the micro objects on the plate 458 using magnetic or charge patterns on the plate 458 that correspond to the magnetic or charge patterns of the micro objects. Where a micro object is encoded with a pattern, a corresponding pattern on the plate 458 attracts the micro object to the plate 458, while at the same time orienting and positioning the micro object relative to the corresponding charge pattern on the plate 458.

To generate the patterns on the plate 458, a field generator 460 is employed. The field generator 460 includes a planar array 462 of electrodes or coils permanently affixed to the plate 458 opposite the micro objects 452. The planar array 462 is driven by programmable power sources of the field generator 460, such as programmable voltage sources. Typically, the planar array 462 is two-dimensional. Where the micro objects 452 are magnetically patterned, the planar array 462 includes coils, and where the micro objects 452 are charge patterned, the planar array 462 includes electrodes. The field generator 460 can also expose the micro objects 452 to the driving force to overcome stiction and better facilitate alignment of the micro objects.

A photoconductor 464, such as a cylindrical photoconductor, optionally receives micro objects from the transporter 456. As discussed above, these micro objects are arranged in known positions and orientations. While not necessary, the photoconductor 464 can be patterned to better position and orient the micro objects received from the transporter 456. This charging can, for example, be performed by an optical pattern writer 466, such as a laser printer raster output scanner (ROS), or by a planar electromagnetic array.

By way of the photoconductor 464, positioned and oriented micro objects are transferred to a final substrate 468 at a transfer region 470. While not necessary, the final substrate 468 is preferably non-stationary, which can advantageously aid in achieving proper positioning of the micro objects on the final substrate 468. After transfer of the micro objects on the photoconductor 464 to the final substrate 468, the micro objects are finally placed and oriented.

Through experiments studying the dynamics of micro objects in response to electric fields, it was determined that an insulator intermediate an electrode array and micro objects is necessary to prevent charge transfer between the micro objects and the electrodes. However, it was also determined that the insulator does not need to be permanently affixed to the electrode array. Experiments have successfully manipulated micro objects with electrodes that were insulated by simply placing a piece of microscope cover glass or a plastic film on top of the electrodes without any adhesives or bonding steps.

Referring back to FIG. 1, as an alternative to U.S. patent application Ser. No. 12/754,245, in some embodiments, the micro objects 16 are positioned and oriented directly on a substrate that is not permanently (i.e., impermanently) affixed to the field generator. This advantageously allows the micro objects 16 to be directly positioned and oriented on the final substrate. In contrast, U.S. patent application Ser. No. 12/754,245 has the micro objects 16 positioned and oriented on an intermediary substrate before transfer to the final substrate. Notwithstanding that it is advantageous to directly position and orient the micro objects 16 directly on the final substrate, it is to be appreciated that the micro objects 16 can still be indirectly positioned and oriented on the final substrate. This can, for example, be performed in the same manner as U.S. patent application Ser. No. 12/754,245 with the main differences being that the field generator is not be permanently affixed to the transporter.

Figure 26:
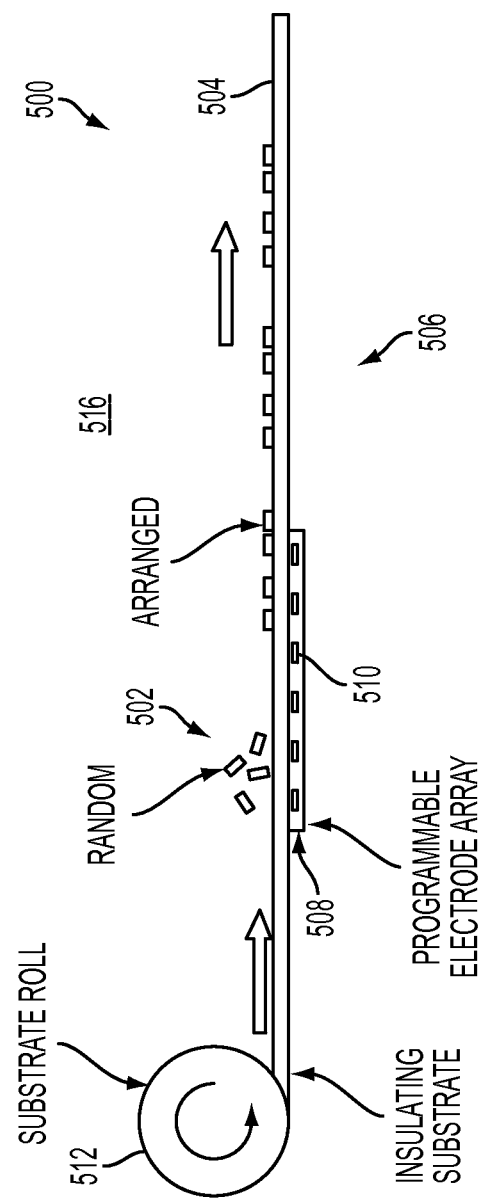
FIG. 26 illustrates a system for positioning and orienting micro objects directly on a final substrate using a static array of electrodes.
Figure 27:
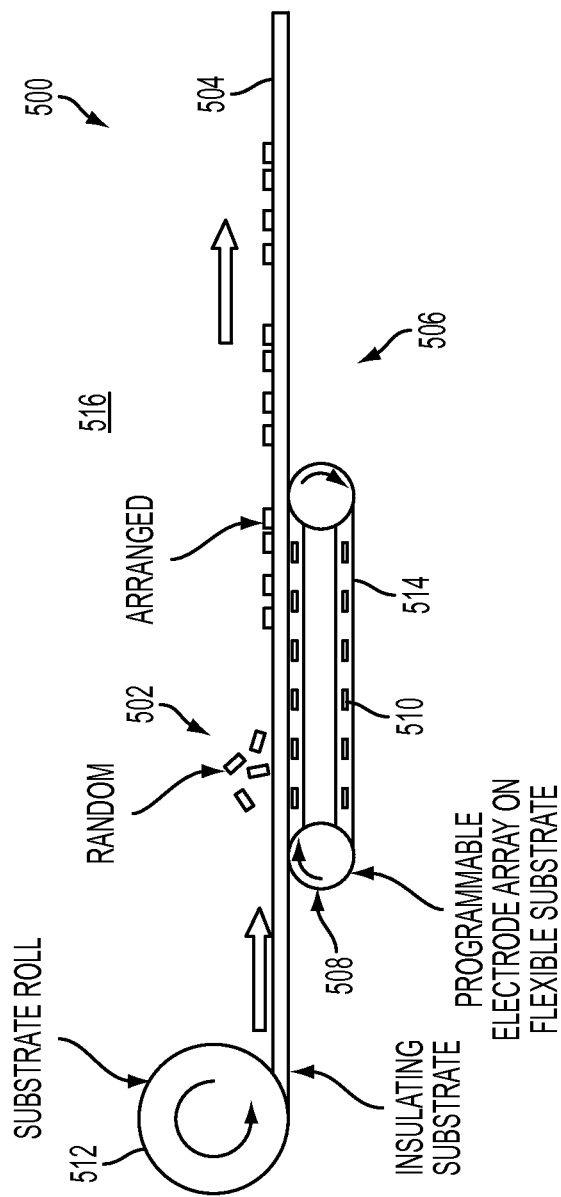
FIG. 27 illustrates another system for positioning and orienting the micro objects directly on a final substrate using a moving array of electrodes.

With reference to FIGS. 26 and 27, a manipulation system 500 positioning micro objects 502 on an insulating substrate 504 that is not permanently affixed to a field generator 506 is provided. The field generator 506 employs electric or magnetic fields to manipulate the micro objects 502 depending upon whether the micro objects 502 are charge patterned or magnetically patterned. As illustrated, the field generator 506 employs an array 508 of electrodes or coils 510 to generate the electric or magnetic fields, as described above (e.g., with FIGS. 3A and 3B). The planar array 508 is driven by programmable power sources of the field generator 506, such as programmable voltage sources. Further, the array 508 is typically two-dimensional.

The substrate 504 is fed over the electric or magnetic fields produced by the field generator 506 from storage. As illustrated, the substrates 504 is stored on a drum or roll 512 and fed over the array 508. The field generator 506 can remain fixed relative to the substrate 504, as illustrated by the fixed position of the array 508 in FIG. 26. Alternatively, the field generator 506 can move with the substrate 504 to reduce wear on the field generator 506 (e.g., by a embedding at least part of the field generator 506 in a flexible conveyer belt 514, or on a drum), as illustrated by the array 508 embedded with the conveyer belt 514 of FIG. 27. Further, a fluid 516, such as a dielectric fluid, typically covers the substrate 504 opposite the field generator 506.

As the substrate 504 is fed over the electric or magnetic fields, the randomly arranged micro objects 502 are added to the fluid 516 or the surface of the substrate 504 opposite the field generator 506. Concurrently therewith, the field generator 506 generates electric or magnetic fields to position and orient the micro objects 502 on the substrate 504 into pre-defined patterns, optionally after charging or recharging the micro objects 502. For example, the illustrated array 508 can be controlled by power sources to generate manipulation signals, and optionally driving signals to reduce stiction and/or charging signals to charge or recharge the micro objects 502. Typically, the micro objects 502 are positioned and oriented by generating corresponding patterns on the substrate 504 using the field generator 506.

Referring back to FIG. 1, after the micro objects 16 are positioned and oriented 22 on the final substrate, the micro objects 16 undergo post processing 24 by a post processing system. Post processing typically includes one or more of fixing the micro objects 16 to the final substrate, planarizing the micro objects 16, and wiring the micro objects 16. Fixation, planarization and wiring can be achieved through any number of well-known means. Further, fixation, planarization and wiring can be achieved at the same location where the micro objects 16 are arranged, at a separate location, or spread between a plurality of locations, which can include the location where the micro objects 16 are arranged.

Fixation can, for example, be achieved using a monomer solution of a light curable polymer as a dielectric fluid within which the micro objects 16 are arranged on the final substrate. Once micro objects are arranged on the final substrate, light is directed to the regions adjacent the micro objects to initiate polymerization and thereby fix the micro objects to the final substrate. As another example, fixation can be achieved by thermally fusing the micro objects 16 to the final substrate. With a polymer substrate, the area of the substrate upon which a micro object is positioned and oriented is locally heated and melted to fix the micro object in place. Local heating can, for example, be accomplished by focusing an infrared laser on the area. As another example, fixation can be achieved by adhering the micro objects 16 to the final substrate with an adhesive. With an adhesive, the adhesive is locally cured around the micro objects 16. As another example, fixation can be achieved by embossing the micro objects 16 into the final substrate. As another example, fixation can be achieved through localized curing of an adhesive. Planarization can, for example, be achieved by embossing, or spin coating a polymer over the micro objects 16 and the final substrate. Wiring can, for example, be achieved by photo patterning metal wires or inkjet printing metal lines.

In some embodiments, after fixing micro objects to any given region of the final substrate, but before these micro objects are planarized and wired, the region is passed over the electric and magnetic fields generated by the manipulation system again, thereby allowing additional micro objects to be fixed to the region. This loop of positioning and orienting micro objects on a region of a final substrate, followed by fixing these micro objects to the region, can be performed one or more times to increase the fill factor and generate different types of micro assemblies. For example, the final substrate can be divided into a plurality of region, each corresponding to a specific micro assembly. The number of times the above described loop is performed for each of these regions then depends upon the specific micro assembly of the region. Once looping is complete for a region, the micro objects of the region can undergo planarization and wiring.

Figure 28:
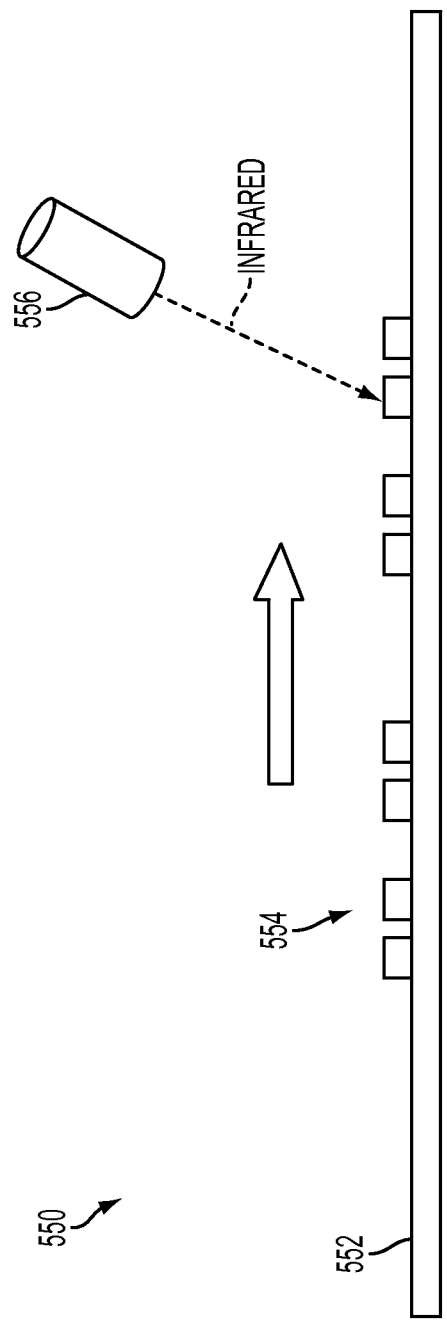
FIG. 28 illustrates a post processing system to complete micro assemblies.

With reference to FIG. 28, an example of a post processing system 550 is provided. The post process system 550 receives a final substrate 552 upon which micro objects 554 are positioned and oriented, and fixes the micro objects 16 to the final substrate 552 using a fixation device 556. Numerous approaches can be employed to fix the micro objects 554. However, as illustrated, the fixation device 556 fixates the micro objects 554 to the final substrate 552 using infrared light directed to the regions adjacent the micro objects 554. The infrared light locally heats and melts the regions of the final substrate 552 upon which the micro objects 554 are positioned. When the regions of the final substrate 552 cool, the micro objects 554 become fixed to the final substrate 552.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A system for forming charge patterns on micro objects, said system comprising:
   a micro object including a rectifying device, the rectifying device exhibiting an asymmetric current-voltage (I-V) response curve, the micro object includes a substrate, and wherein the rectifying device is formed on or in the substrate; and
   a device external to the micro object, configured to generate an electric or magnetic field to induce a flow of charge through the rectifying device, wherein the device external to the micro object induces the flow of charge through the rectifying device using capacitive or magnetic coupling, and wherein the device external to the micro object which generates the electric or magnetic field, uses at least a part of the electric or magnetic field to generate charge patterns, and wherein motion is induced as an interaction of the electric or magnetic field, induced charge and the micro-object.

2. The system of claim 1, wherein the micro object further includes:
   an insulator with a first side adjoining the substrate, and a second side adjoining two coupling electrodes opposite the first side of the insulator.

3. The system of claim 1, wherein the rectifying device includes at least one diode.

4. The system of claim 1, wherein the rectifying device includes a thin film diode.

5. The system of claim 4, wherein the thin film diode includes at least one of an s-Si:H PIN diode and an organic thin film diode.

6. The system of claim 1, wherein the rectifying device includes a thin film Schottky diode.

7. The system of claim 6, wherein the thin film Schottky diode includes a thin film material being one of cadmium selenide (CdSe) and gallium indium zinc oxide (GIZO).

8. The system of claim 1, wherein a terminal of the rectifying device is connected to an external environment of the micro object.

9. The system of claim 1, wherein the device external to the micro object is configured to generate light incident on the rectifying device to induce the flow of charge through the rectifying device.

10. The system of claim 9, wherein the rectifying device is a photodiode.

11. A system for forming charge patterns on micro objects, said system comprising:
    a micro object including a rectifying device, the rectifying device exhibiting an asymmetric current-voltage (I-V) response curve, the micro object includes a substrate, and wherein the rectifying device is formed on or in the substrate; and a device external to the micro object configured to induce a flow of charge through the rectifying device, wherein the device external to the micro object induces the flow of charge through the rectifying device using capacitive or magnetic coupling, wherein the device external to the micro object induces the flow of charge by generating a static electric field, and wherein the micro object is moving relative to the device.

12. A system for forming charge patterns on micro objects, said system comprising:

a micro object including a first rectifying device, the first rectifying device exhibiting an asymmetric current-voltage (I-V) response curve, the micro object includes a substrate, and wherein the first rectifying device is formed on or in the substrate, and wherein the micro object includes a second rectifying device exhibiting an asymmetric I-V response curve, wherein the first rectifying device and the second rectifying device are configured to induce the flow of charge between opposing surfaces of the micro object and to induce the flow of charge between opposing ends of the surfaces; and a device external to the micro object configured to induce a flow of charge through the rectifying device, wherein the device external to the micro object induces the flow of charge through the rectifying device using capacitive or magnetic coupling.

13. A system for forming charge patterns on micro objects, said system comprising:

a micro object including a rectifying device, the rectifying device exhibiting an asymmetric current-voltage (I-V) response curve, the micro object includes a substrate, and wherein the rectifying device is formed on or in the substrate, wherein the micro object further includes a first insulator with a first side adjoining the substrate, and a second side adjoining two coupling electrodes opposite the first side of the first insulator, and wherein the micro object further includes a second insulator adjoining the second side of the first insulator and positioned over the two coupling electrodes; and a device external to the micro object configured to induce a flow of charge through the rectifying device, wherein the device external to the micro object induces the flow of charge through the rectifying device using capacitive or magnetic coupling.

* * * * *